United States Patent
Kitabatake

(10) Patent No.: US 8,030,758 B2
(45) Date of Patent: Oct. 4, 2011

(54) SEMICONDUCTOR MODULE AND METHOD FOR FABRICATING SEMICONDUCTOR MODULE

(75) Inventor: Makoto Kitabatake, Nara (JP)

(73) Assignee: Panasonic Corporation, Osaka (JP)

( * ) Notice: Subject to any disclaimer, the term of this patent is extended or adjusted under 35 U.S.C. 154(b) by 107 days.

(21) Appl. No.: 12/373,024

(22) PCT Filed: Sep. 13, 2007

(86) PCT No.: PCT/JP2007/067841
§ 371 (c)(1),
(2), (4) Date: Jan. 8, 2009

(87) PCT Pub. No.: WO2008/035614
PCT Pub. Date: Mar. 27, 2008

(65) Prior Publication Data
US 2009/0309215 A1 Dec. 17, 2009

(30) Foreign Application Priority Data

Sep. 20, 2006 (JP) ................................. 2006-254173

(51) Int. Cl.
*H01L 23/10* (2006.01)
(52) U.S. Cl. ............... 257/707; 257/720; 257/E23.101; 257/E23.103; 257/717

(58) Field of Classification Search .......... 257/706–707, 257/720, E23.101, E23.103, 717
See application file for complete search history.

(56) References Cited

U.S. PATENT DOCUMENTS

| 4,103,737 | A | * | 8/1978 | Perkins ...................... 165/109.1 |
| 4,508,163 | A | * | 4/1985 | McCarthy .................... 165/80.2 |
| 5,291,065 | A | * | 3/1994 | Arai et al. ..................... 257/723 |
| 2002/0167800 | A1 | * | 11/2002 | Smalc ............................ 361/710 |
| 2003/0210719 | A1 | * | 11/2003 | Yamamoto et al. ............. 372/36 |
| 2007/0181908 | A1 | * | 8/2007 | Otremba ........................ 257/107 |

FOREIGN PATENT DOCUMENTS

| JP | 2005-235929 | 9/2005 |
| JP | 2005-251994 | 9/2005 |

* cited by examiner

*Primary Examiner* — Leonardo Andujar
(74) *Attorney, Agent, or Firm* — McDermott Will & Emery LLP

(57) ABSTRACT

A semiconductor module (10) includes a heat sink (1), an electronic component (2), a semiconductor device (3), and a thermally-conductive sheet member (4). The thermally-conductive sheet member (4) covers a part of the semiconductor device (3) and has a lower part (4b) and a side part (4c). The lower part (4b) is in contact with a mounting face (11a) of the heat sink (1). The side part (4c) extends from the lower part (4b) and covers a first side surface (3c) of the semiconductor device (3). The electronic component (2) is disposed across the side part (4c) of the thermally-conductive sheet member (4) from the semiconductor device (3).

15 Claims, 17 Drawing Sheets

SEMICONDUCTOR MODULE AND METHOD FOR FABRICATING SEMICONDUCTOR MODULE

RELATED APPLICATIONS

This application is the U.S. National Phase under 35 U.S.C. §371 of International Application No. PCT/JP2007/067841, filed on Sep. 13, 2007, which in turn claims the benefit of Japanese Application No. 2006-254173, filed on Sep. 20, 2006, the disclosures of which Applications are incorporated by reference herein.

TECHNICAL FIELD

The present invention relates to semiconductor modules including semiconductor devices and electronic components and methods for fabricating the same.

BACKGROUND ART

Semiconductor power modules (semiconductor modules) have conventionally been thermally designed, for example, in the following manner: In order to cool a semiconductor power device (a semiconductor device which generates heat by the operation of a semiconductor power module and consequently the temperature of which becomes high) and keep the above temperature below the safe operating temperature of the semiconductor power module, the semiconductor power device is brought into contact with a package base material (a heat sink). Accordingly, in the case where a power module is constructed by using a plurality of semiconductor power devices, it is necessary to bring every semiconductor power device into contact with a package base material.

Furthermore, semiconductor power modules include a module configured so that a semiconductor power device and a control circuit for controlling the semiconductor power device or a passive component, such as a capacitor, are mounted on the same package base material. For example, Patent Document 1 discloses a power converter (semiconductor module) 80 configured so that, as shown in FIGS. 24(*a*) and 24(*b*), a main circuit (semiconductor device) 83 and a control circuit 82 are contained in the same package 81. In the power converter 80 shown in FIG. 24(*a*), a plate-like shield 88 is inserted between the main circuit 83 and the control circuit 82, thereby blocking heat and electromagnetic noise both generated by the main circuit 83.

Patent Document 1 also discloses the following configuration: In a power converter 180 shown in FIG. 24(*b*), a U-shaped shield 188 is placed in the package 81 to section the package 81 into two parts. In this configuration, the shield 188 completely covers the heat-generating main circuit 83. Moreover, through holes are formed in the shield 188. A signal line 189 for electrically connecting the control circuit 82 or a passive component located outside the shield 188 to a semiconductor power device, a signal line 189 for supplying a control signal from the control circuit 82 or a passive component located outside the shield 188 to a semiconductor power device, or any other element passes through each of the through holes.

Patent Document 1: Japanese Unexamined Patent Application Publication No. 2005-235929

DISCLOSURE OF THE INVENTION

Problems that the Invention is to Solve

In the case where a semiconductor power module is constructed by using a plurality of semiconductor power devices, the temperature rise needs to be prevented by sufficiently releasing heat generated by the semiconductor power devices and sufficiently spacing the semiconductor power devices from one another. Accordingly, the area of the mounting face of an associated package base material on which the semiconductor power devices are mounted needs to be equal to or larger than the sum total of the areas of the bottom surfaces of the semiconductor power devices. In view of the above, the package becomes so large that the semiconductor power module is hardly reduced in size.

Furthermore, for a semiconductor power module configured so that a semiconductor power device and a control circuit or a passive component are mounted on the same package base material, in consideration of a case where the temperature of a component mounted thereon may rise due to the operation of the semiconductor power module, all the components mounted thereon are preferably operable at the upper limit of the guaranteed temperature range of the semiconductor power device. This upper limit is, for example, approximately 120° C., and a control circuit or passive component operable at such a high temperature is limited. Hence, the choices of components to be mounted are narrowed down so that the semiconductor power module cannot be freely designed. Furthermore, in some cases, a control circuit or passive component operable even at high temperatures is expensive. Use of such an expensive control circuit or passive component for a semiconductor power module increases the cost of the semiconductor power module.

Meanwhile, in the power converter 80 shown in FIG. 24(*a*), it is difficult to efficiently cool the shield 88 itself. More particularly, the shield 88 can block radiant heat, but the shield 88 itself is not cooled. Therefore, the temperature of the control circuit 82 or any other component placed above the shield 88 is hardly maintained low. In view of the above, in the power converter 80 shown in FIG. 24(*a*), it is difficult to completely block heat that has been generated by the main circuit 83 for a long period, and thus it is difficult to completely isolate the heat from the control circuit 82 or any other component.

Furthermore, when, in the power converter 180 shown in FIG. 24(*b*), the main circuit 83 or any other component is packaged, wiring needs to be carried out so that a control signal can be transmitted through the through holes formed in the shield 188. This wiring complicates a fabrication process and makes it difficult to reduce the production cost of the power converter.

The present invention has been made in view of the above-mentioned point, and its object is to provide a semiconductor module that can maintain the temperature of a capacitor, a control circuit or any other component low even under the condition that a semiconductor device has generated heat and thus its temperature has been high.

Means of Solving the Problems

In order to solve the above-mentioned problems, a semiconductor module of the present invention includes: a heat sink having a mounting face; a semiconductor device mounted on the mounting face, the semiconductor device generating a relatively large amount of heat during operation; an electronic component mounted on the mounting face, the electronic component generating a relatively small amount of heat during operation; and a thermally-conductive sheet member covering part of a target component being any one of the semiconductor device and the electronic component. The thermally-conductive sheet member has a lower part coming into contact with the mounting face and a side part extending from the lower part to cover a first side surface of the target component, and the surface area of the lower part is ⅕ or more of the surface area of the thermally-conductive sheet member. The other component different from the target component is disposed across the side part of the thermally-conductive sheet member from the target component.

With this configuration, heat of the heat sink (heat of cooling) is transmitted through the lower part to the entire thermally-conductive sheet member. This transmission allows efficient heat isolation. Furthermore, in a case where the target component is the semiconductor device, this case can suppress a rise in the temperature of the thermally-conductive sheet member due to heat generated by the semiconductor device.

Moreover, since the surface area of the lower part of the thermally-conductive sheet member is ⅕ or more of the surface area of the thermally-conductive sheet member, this situation allows heat of the heat sink (heat of cooling) to be efficiently transmitted to the entire thermally-conductive sheet member.

For example, such a phrase as "cover part of a target component" herein means that the thermally-conductive sheet member is not only disposed to come into contact with part of the target component but also disposed over part of the target component while being away from the surfaces of the target component.

Furthermore, the phrase "heat isolation" herein means that heat is kept from being exchanged between the semiconductor device and the electronic component and is blocked. More specifically, it means that heat generated by the semiconductor device is insignificantly transmitted to the electronic component.

In addition, when the target component is the semiconductor device, "the other component different from the target component" is the electronic component, and when the target component is the electronic component, "the other component different from the target component" is the semiconductor device.

In the semiconductor module of the present invention, the thermal conductivity of the thermally-conductive sheet member is preferably 400 W/(m·K) or more. Furthermore, the thermally-conductive sheet member is more preferably a graphite sheet.

In the semiconductor module of the present invention, the thermally-conductive sheet member may further have an upper part extending from the side part to cover at least part of the top surface of the target component.

In a later-described preferred embodiment, the lower part of the thermally-conductive sheet member is interposed between the mounting face and the bottom surface of the target component. In this case, the semiconductor module may further include an electrode terminal and a conductive wire. The conductive wire may extend from the target component outward of the thermally-conductive sheet member while passing between the upper and lower parts of the thermally-conductive sheet member, and thereby the conductive wire may be connected to the electrode terminal.

In another later-described preferred embodiment, the lower part of the thermally-conductive sheet member is disposed on a part of the mounting face between the target component and the other component. In this case, the semiconductor module may further include an electrode terminal and a conductive wire. The conductive wire may extend from the target component outward of the thermally-conductive sheet member while passing between the upper part of the thermally-conductive sheet member and the mounting face, and thereby the conductive wire may be connected to the electrode terminal.

It is preferable that the semiconductor module of the present invention further includes an insulating member interposed between the target component and the thermally-conductive sheet member. This can prevent a short circuit from being caused between the target component and the thermally-conductive sheet member.

In the semiconductor module of the present invention, the electronic component may be disposed above the top surface of the semiconductor device.

It is preferable that the semiconductor module of the present invention further includes a heat spreading plate disposed between the mounting face and the bottom surface of the semiconductor device. This permits the release of heat generated by the semiconductor device.

A method for fabricating a semiconductor module according to a first aspect of the present invention includes the steps of: (a) disposing a thermally-conductive sheet member on a mounting face of a heat sink to bring a first part of the thermally-conductive sheet member having an area of ⅕ or more of the surface area of the thermally-conductive sheet member into contact with the mounting face; (b) mounting a target component on the first part of the thermally-conductive sheet member, the target component being any one of a semiconductor device and an electronic component; (c) bending the thermally-conductive sheet member so that a second part of the thermally-conductive sheet member covers a first side surface of the target component; and (d) mounting the other component different from the target component across the second part of the thermally-conductive sheet member from the target component.

A method for fabricating a semiconductor module according to a second aspect of the present invention includes the steps of: (a) mounting a target component on a mounting face of a heat sink, the target component being any one of a semiconductor device and an electronic component; (b) disposing a thermally-conductive sheet member on the mounting face of the heat sink while bending the thermally-conductive sheet member in order that a first part of the thermally-conductive sheet member having an area of ⅕ or more of the surface area of the thermally-conductive sheet member comes into contact with the mounting face of the heat sink and a second part of the thermally-conductive sheet member covers a first side surface of the target component; and (c) mounting the other component different from the target component across the second part of the thermally-conductive sheet member from the target component.

When a semiconductor module is fabricated using the fabrication method according to the first or second aspect of the present invention, a thermally-conductive sheet member can be disposed to come into contact with a part of a heat sink and cover a part of a target component. Therefore, a semiconductor module can be provided which achieves efficient heat isolation.

A method for fabricating a semiconductor module according to a third aspect of the present invention includes the steps of: (a) disposing a thermally-conductive sheet member on a mounting face of a heat sink to bring a first part of the thermally-conductive sheet member having an area of ⅕ or more of the surface area of the thermally-conductive sheet member into contact with the mounting face and mounting a semiconductor device on the first part of the thermally-conductive sheet member; (b) disposing an electronic component above the top surface of the semiconductor device; and (c) bending the thermally-conductive sheet member in order that a second part of the thermally-conductive sheet member covers at least part of the top surface of the semiconductor device.

A method for fabricating a semiconductor module according to a fourth aspect of the present invention includes the steps of: (a) mounting a semiconductor device on a mounting face of a heat sink and disposing an electronic component above the top surface of the semiconductor device; and (b) disposing a thermally-conductive sheet member on the heat sink while bending the thermally-conductive sheet member in order that a first part of the thermally-conductive sheet member having an area of 1/5 or more of the surface area of the thermally-conductive sheet member comes into contact with the mounting face of the heat sink and a second part of the thermally-conductive sheet member covers at least part of the top surface of the semiconductor device.

When a semiconductor module is fabricated using the fabrication method according to the third or fourth aspect of the present invention, a thermally-conductive sheet member can be disposed to come into contact with a part of a heat sink and cover a part of a semiconductor device. Therefore, a semiconductor module can be provided which achieves efficient heat isolation.

In the fabrication method according to each of the first through fourth aspects of the present invention, a sheet member made of a material having a thermal conductivity of 400 W/(m·K) or more is preferably used as a thermally-conductive sheet member.

EFFECTS OF THE INVENTION

According to the present invention, on condition that an electronic component generating a small amount of heat, such as a control circuit or a passive component, is mounted on a heat sink on which a semiconductor device is mounted, even if the semiconductor device generates heat and thus the temperature of the semiconductor device becomes high, the electronic component can be kept at relatively low temperatures.

Figure 1A:
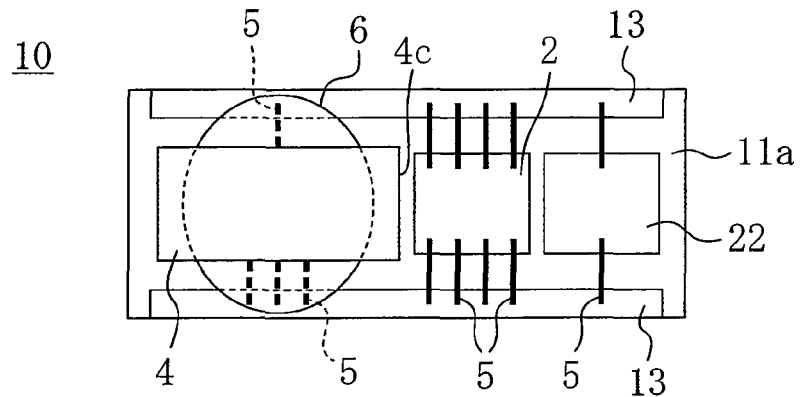
FIG. 1(a) is a top view showing the configuration of a semiconductor module according to a first embodiment of the present invention.

DESCRIPTION OF REFERENCE NUMERALS 1, 81 heat sink
2, 82 electronic component
3, 83 semiconductor device
4, 84 thermally-conductive sheet member
4a upper part
4b lower part
4c side part
5 conductive wire
6 insulating member
7 heat spreading plate
10, 20, 30, 40, 50, 60, 70, 80, 180 semiconductor module
11a mounting face
13 electrode terminal
161 first region
162 second region
163 third region

BEST MODE FOR CARRYING OUT THE INVENTION

Semiconductor modules according to embodiments of the present invention will be described hereinafter with reference to the drawings. In the following drawings, for simplification of description, components having substantially the same function are denoted by the same reference numeral. The present invention is not limited to the following embodiments.

Embodiment 1 of the Invention

Figure 1B:
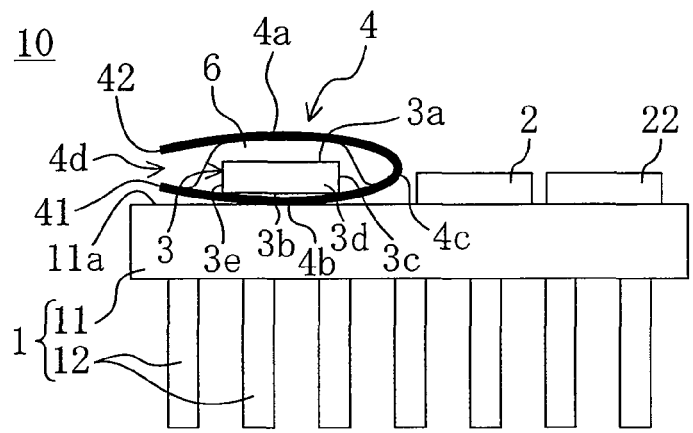
FIG. 1(b) is a side view thereof.
Figure 2:
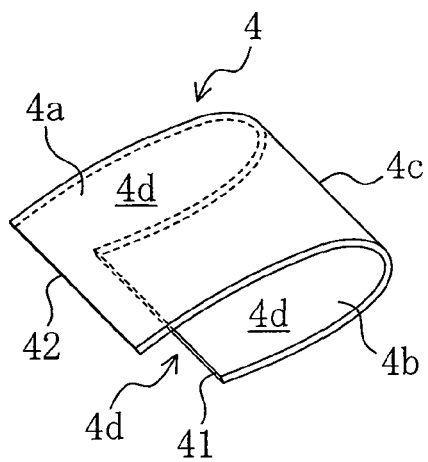
FIG. 2 is a perspective view of a thermally-conductive sheet member according to the first embodiment of the present invention.

FIG. 1 are schematic diagrams of a semiconductor module 10 according to a first embodiment, in which FIG. 1(a) is a top view thereof and FIG. 1(b) is a side view thereof. In FIG. 1(b), conductive wires 5, 5, . . . are not shown. FIG. 2 is a perspective view of a thermally-conductive sheet member 4 according to this embodiment.

The semiconductor module 10 according to this embodiment includes a heat sink 1, a semiconductor device 3, electronic components 2 and 22, the thermally-conductive sheet member 4, and the conductive wires 5, 5, . . . . The semiconductor device 3 and the electronic components 2 and 22 are mounted on a mounting face 11a of the heat sink 1 and electrically connected through the conductive wires 5, 5, . . . to, for example, electrode terminals 13 disposed on the heat sink 1. The thermally-conductive sheet member 4 covers a part of the semiconductor device 3. Fine electrodes (bus bars) placed on the electrode terminals 13 are not shown.

The semiconductor module 10 according to this embodiment will be described in detail. The heat sink 1 has a board 11, and the electrode terminals 13 are disposed on the mounting face 11a of the board 11 with an insulative member (not shown) interposed therebetween. On the other hand, a plurality of cooling fins 12, 12, . . . are disposed on the face of the board 11 opposed to the mounting face 11a so as to be spaced from one another.

The semiconductor device 3 is a component that generates a large amount of heat by the operation of the semiconductor module 10 and thus whose temperature becomes high. Any known semiconductor device can be unboundedly used as the semiconductor device 3, and for example, a Schottky diode, a pn-junction diode, a MOSFET (metal oxide semiconductor field-effect transistor), a MESFET (metal semiconductor field-effect transistor), a J-FET (junction field effect transistor), a thyrister, or any other device can be used thereas. Furthermore, the semiconductor device 3 is preferably a wide band gap semiconductor device. The "wide band gap semiconductor" herein means a semiconductor with an energy difference (band gap) between the lower end of the conduction band and the upper end of the valence band, of 2.0 eV or more. Specific examples of such a wide band gap semiconductor can include silicon carbide (SiC), a nitride of a group III element, such as GaN or AlN, and diamond. However, silicon carbide is suitable for this embodiment.

The semiconductor device 3 has four side surfaces. A first side surface 3c of the semiconductor device 3 is the right side surface thereof in FIG. 1(b). A second side surface 3d of the semiconductor device 3 is located adjacent to the first side surface 3c and is the front side surface thereof in FIG. 1(b). A third side surface 3e of the semiconductor device 3 is opposed to the first side surface 3c and is the left side surface thereof in FIG. 1(b). A fourth side surface (not shown) of the semiconductor device 3 is opposed to the second side surface 3d and is the back side surface thereof in FIG. 1(b).

An insulating member 6 made of, for example, a silicone resin is preferably placed between the semiconductor device 3 and the (later-described) thermally-conductive sheet member 4. In general, the top surface of a semiconductor device is often provided with an electrode. When the thermally-conductive sheet member 4 is made of a material having not only thermal conductivity but also electrical conductivity, the contact between the thermally-conductive sheet member 4 and an electrode of the semiconductor device 3 causes a short circuit in the contact area. However, when the insulating member 6 is interposed between the thermally-conductive sheet member 4 and the semiconductor device 3, this situation can avoid the contact between the thermally-conductive sheet member 4 and the electrode, thereby preventing a short circuit from being caused.

Since the electronic components 2 and 22 generate only a small amount of heat even with the operation of the semiconductor module 10, they are both components whose temperatures do not become so high. Each of the electronic components 2 and 22 is, for example, a control component having a control circuit for controlling the semiconductor device 3 or a passive component, such as a resistor, a coil or a capacitor. The electronic components 2 and 22 are not limited to electronic components used at high temperatures and can include various commercially-available electronic components. Examples of the capacitor can include various commercially-available capacitors from chip capacitors to high-capacity electrolytic capacitors or high-capacity film capacitors.

The electronic component 2 is mounted across a (later-described) side part 4c of the thermally-conductive sheet member 4 from the semiconductor device 3. The electronic component 22 is mounted across the electronic component 2 from the semiconductor device 3.

The thermally-conductive sheet member 4 will be described in detail. First, the structure of the thermally-conductive sheet member 4 will be described.

The thermally-conductive sheet member 4 according to this embodiment is bent so that one 41 of its longitudinal ends (hereinafter, simply referred to as "one end of the thermally-conductive sheet member") becomes close to the other one 42 thereof (hereinafter, simply referred to as "the other end of the thermally-conductive sheet member") to the extent that the one end 41 thereof is not in contact with the other end 42 thereof. The bent thermally-conductive sheet member 4 has an upper part 4a, a lower part 4b and the side part 4c. The upper part 4a is located on the other end 42 side, and the lower part 4b is located on the one end 41 side. Therefore, the upper part 4a is not in contact with the lower part 4b. Furthermore, the side part 4c is located between the upper part 4a and the lower part 4b, is a part of the thermally-conductive sheet member 4 formed by bending the thermally-conductive sheet member 4 as described above and juts out away from the first side surface 3c of the semiconductor device 3.

The upper part 4a covers the top surface 3a of the semiconductor device 3, the lower part 4b is interposed between the bottom surface 3b of the semiconductor device 3 and the mounting face 11a, and the side part 4c covers the first side surface 3c of the semiconductor device 3. In this way, the heat of the heat sink 1 (heat of cooling) is sufficiently transmitted through the lower part 4b to the entire thermally-conductive sheet member 4. Therefore, even when the semiconductor device 3 generates heat by the operation of the semiconductor module 10 and thus its temperature becomes high, the temperature of the thermally-conductive sheet member 4 can be kept relatively low (for example, at the temperature of the heat sink 1). This situation can prevent the heat generated by the semiconductor device 3 from being transmitted across the side part 4c of the thermally-conductive sheet member 4. As a result, the temperature of each electronic component 2, 22 can be prevented from rising. In other words, efficient heat isolation can be achieved. Furthermore, since the heat of the heat sink 1 is partially transmitted through the lower part 4b to the semiconductor device 3, this situation can suppress a rise in the temperature of the semiconductor device 3. Moreover, since the surface area of the lower part 4b is ⅕ or more of the surface area of the thermally-conductive sheet member 4 as described below, the heat of the heat sink (heat of cooling) can be efficiently transmitted to the entire thermally-conductive sheet member 4.

Since, as described above, the thermally-conductive sheet member 4 is bent so that the one end 41 becomes close to the other end 42 to the extent that the one end 41 is not in contact with the other end 42, the second side surface 3d, third side surface 3e and fourth side surface of the semiconductor device 3 can be seen from the region 4d between the upper part 4a and the lower part 4b. This region 4d is the region located between the upper part 4a and the lower part 4b when the thermally-conductive sheet member 4 is bent so that the one end 41 becomes close to the other end 42 to the extent that the one end 41 is not in contact with the other end 42. This region 4d is not a region formed by making a hole in the thermally-conductive sheet member 4. In view of the above, even in a case where the semiconductor device 3 is to be electrically connected through the conductive wires 5, 5, . . . to the heat sink 1 or any other component, the conductive wires 5, 5, . . . can be placed to pass through the region 4d between the upper part 4a and the lower part 4b without deliberately forming, in the thermally-conductive sheet member 4, through holes through which the conductive wires 5, 5, . . . are to pass.

Furthermore, since the one end 41 of the thermally-conductive sheet member 4 is not in contact with the other end 42 thereof, this situation can suppress the production of a current (induced current) flowing through the thermally-conductive sheet member 4 in a loop. As a result, heat generation arising from the production of the induced current can be suppressed.

As shown in FIG. 2, the upper part 4a of the thermally-conductive sheet member 4 is not in contact with the lower part 4b thereof at three sides of each part, i.e., the front, back and left sides in FIG. 1(b). However, for example, if the conductive wires 5, 5, . . . are placed only to any two of the three sides, the upper part 4a of the thermally-conductive sheet member 4 may be in contact with the lower part 4b at the other side at which any conductive wire 5, 5, . . . is not placed. The thermally-conductive sheet member 4 simply needs to be bent without being in contact with the conductive wires 5, 5, . . . .

Next, the physical properties (thermal conductivity, thermal diffusivity and other properties) of the thermally-conductive sheet member 4 will be described.

The thermal conductivity of the thermally-conductive sheet member 4 along the plane thereof is preferably 400 W/(m·K) or more, more preferably 800 W/(m·K) or more and most preferably approximately 1600 W/(m·K). The thermal conductivity of the thermally-conductive sheet member 4 along the thickness thereof is preferably 8 W/(m·K) through 15 W/(m·K) both inclusive. Thus, the anisotropy of the thermal conductivity of the thermally-conductive sheet member 4 is preferably large. More specifically, the thermal conductivity of the sheet along the thickness thereof is preferably 1/20 or less of that of the sheet along the plane thereof.

Furthermore, the thickness of the thermally-conductive sheet member 4 is preferably 0.025 mm through 0.3 mm both inclusive, and the thermal diffusivity thereof is preferably $3\times10^{-4}$ m$^2$/s through $10\times10^{-4}$ m$^2$/s both inclusive. In this connection, copper has a thermal conductivity of approximately 390 W/(m·K) and a thermal diffusivity of approximately $1.4\times10^{-4}$ m$^2$/s. Aluminum has a thermal conductivity of approximately 230 W/(m·K) and a thermal diffusivity of approximately $0.9\times10^{-4}$ m$^2$/s. In view of the above, the thermal conductivity of the thermally-conductive sheet member 4 along the plane thereof is larger than that of copper or aluminum, and the thermal diffusivity of the thermally-conductive sheet member 4 is larger than that of copper or aluminum.

Such thermally-conductive sheet members have conventionally been used as heat spreaders or heat spreading plates in order to release heat while improving their heat-release characteristics. However, in the present invention, the thermally-conductive sheet member 4 is utilized as a partitioning member for partitioning a module into regions according to their temperatures and used as a cool heat-isolated sheet member for transmitting the temperature of the heat sink 1 to a heat-generating component (the semiconductor device 3) without being used to release heat from the heat-generating component. In view of the above, the intended purpose of the thermally-conductive sheet member 4 of the present invention is completely different from that of the known thermally-conductive sheet member. Even on condition that the temperature increases in the vicinity of a heat-generating component (the semiconductor device 3), if the heat-generating component is partially covered with this thermally-conductive sheet member 4, this situation can suppress a rise in the temperature of components (the electronic components 2 and 22) across the thermally-conductive sheet member 4 from the heat-generating component.

For example, if a sheet member having a thermal conductivity of 400 W/(m·K) along the plane of the sheet, a thermal conductivity of 20 W/(m·K) along the thickness thereof and a thickness of 0.1 mm or less is used as the thermally-conductive sheet member 4 and the area of the bottom surface of the semiconductor device is 1×1 cm$^2$, assuming that the thermal conductivity of the sheet member is TC (W/(m·K)), the cross-sectional area of the sheet member taken along the direction perpendicular to the direction of heat conduction is S (m$^2$), the temperature difference between the highest and lowest temperatures of the sheet member is K (°K), and the length of the sheet member is LL (m), the amount W of heat transmitted through the thermally-conductive sheet member can be expressed in the following manner.

$$W=(TC\times S)/(LL\times K) \quad (1)$$

The TC of the sheet member along the plane thereof is equal to 400, and S=(1×10$^{-2}$)×(1×10$^{-4}$)=1×10$^{-6}$. Therefore, the amount W1 of heat transmitted along the plane of the sheet member is expressed in the following manner.

$$W1=(4\times10^{-4})/(LL\times K) \quad (2)$$

The TC of the sheet member along the thickness thereof (the direction going from the mounting face 11a to the semiconductor device 3) is equal to 20, and S=(1×10$^{-2}$)×(1×10$^{-2}$)=1×10$^{-4}$. Therefore, the amount W2 of heat transmitted along the thickness of the sheet member is expressed in the following manner.

$$W2=(2\times10^{-3})/(LL\times K) \quad (3)$$

The heat amount W2 becomes five times larger than the heat amount W1. It is seen from the above that the thermally-conductive sheet member 4 can transmit, along its thickness, five times the heat amount transmitted along its plane. In other words, in order that W1 and W2 in the above-described expressions can have substantially the same value, the area of the sheet along the thickness thereof (the area in which the thermally-conductive sheet member 4 is in contact with the mounting face 11a) needs to be ⅕ of the area of the sheet along the plane thereof.

For the thermally-conductive sheet member 4 of this embodiment, as described above, the heat of the heat sink 1

(heat of cooling) is initially transmitted to the lower part 4b, and then the transmitted heat is transmitted from the lower part 4b to the side part 4c and the upper part 4a in this order. In other words, the heat of the heat sink 1 is initially transmitted along the thickness of the thermally-conductive sheet member 4 (heat transmission to the lower part 4b), and then the transmitted heat is transmitted along the plane thereof (heat transmission from the lower part 4b to the side part 4c and the upper part 4a). As seen from the above-mentioned calculated results, in order to transmit the same heat amount along both the plane and thickness of the sheet, the area of the sheet along the thickness thereof needs to be ⅕ of the area of the sheet along the plane thereof. Therefore, when the surface area of the lower part 4b is approximately ⅕ of the surface area of the thermally-conductive sheet member 4, the heat of the heat sink 1 can be transmitted to the entire thermally-conductive sheet member 4.

The surface area of the lower part 4b is preferably ⅕ of the surface area of the thermally-conductive sheet member 4. Meanwhile, in view of thermal contact, the surface area of the lower part 4b is preferably ¼ or more of the surface area of the thermally-conductive sheet member 4 and more preferably ⅓ or more thereof. On the other hand, in order to reduce the size of the semiconductor module 10, the surface area of the lower part 4b is preferably smaller. As seen from the above, in consideration of a demand for the thermal conduction efficiency of the heat sink 1 (the cooling efficiency of the heat sink 1), a demand for reduction in the size of the semiconductor module 10 and the status of use of the semiconductor module 10, the ratio of the surface area of the lower part 4b to the surface area of the thermally-conductive sheet member 4 is preferably determined using ⅕ as a reference value.

Since in this embodiment the lower part 4b is interposed between the heat sink 1 and the bottom surface 3b of the semiconductor device 3, it is considered that the surface area of the lower part 4b inevitably becomes ⅕ or more of the entire surface area of the thermally-conductive sheet member 4.

The thermally-conductive sheet member 4 is preferably made of a material having the above-described thermal conductivity and most preferably made of a graphite sheet. The reason why it is most preferably made of a graphite sheet is as follows: Since a graphite sheet has excellent thermal conductivity and electrical conductivity, use of a graphite sheet as the thermally-conductive sheet member 4 permits not only blockage of heat generated by the semiconductor device 3 but also the absorption of noise from an electromagnetic wave generated by the switching of the semiconductor device 3, resulting in a reduction in noise generated by the semiconductor device 3.

For example, a graphite sheet that is commercially available as a "PGS graphite sheet" manufactured by Matsushita Electric Industrial Co., Ltd. or a graphite sheet that is commercially available as a "super λ GS" manufactured by Geltec Co., Ltd. can be used as the above-described graphite sheet. The thermal conductivities of the above-described graphite sheet along both the plane and thickness thereof fall within the above-mentioned associated ranges. More specifically, the thermal conductivity of the above-described sheet along the plane thereof is 400 W/(m·K) or more, that of a usual graphite sheet is approximately 800 W/(m·K), and that of the best graphite sheet is approximately 1600 W/(m·K). The thermal conductivity of the sheet along the thickness thereof is 8 W/(m·K) through 15 W/(m·K) both inclusive. In view of the above, the anisotropy of the thermal conductivity of the graphite sheet is large.

In a case where a graphite sheet is used as the thermally-conductive sheet member 4, a graphite sheet whose thickness and thermal conductivity fall within the above-mentioned associated ranges is preferably used.

Next, a description will be given of a fabrication method for a semiconductor module 10 according to this embodiment. FIGS. 3(a) through 3(d) are top views showing the fabrication method for the semiconductor module 10.

Figure 3A:
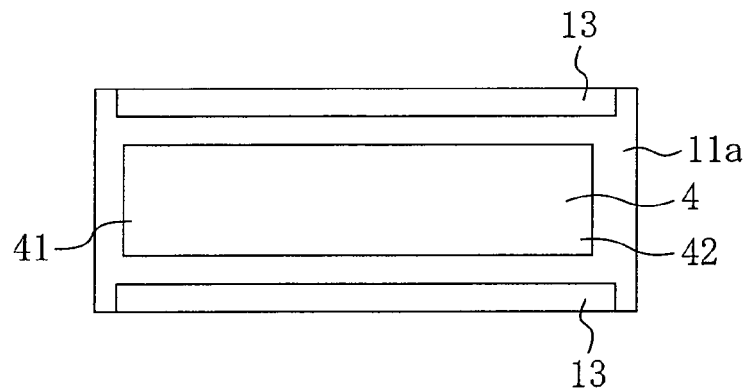
FIGS. 3(a) through 3(d) are top views showing a fabrication method for a semiconductor module according to the first embodiment of the present invention.

First, as shown in FIG. 3(a), a thermally-conductive sheet member 4 is disposed on a mounting face 11a of a heat sink 1 (step (a)). Then, a part of the thermally-conductive sheet member 4 located on one end 41 side thereof (exactly, a part thereof located on the one end 41 side thereof and occupying ⅕ or more of the surface area of the thermally-conductive sheet member 4 (a first part)) is adhered to the mounting face 11a of the heat sink 1.

In a case where a graphite sheet is used as the thermally-conductive sheet member, an adhesion method in which the graphite sheet is adhered through a carbonized metal to the mounting face is preferably used. More specifically, a metal, such as Ti, Mo or W, is initially evaporated onto the lower surface of the graphite sheet, and the interface between the evaporated metal and the graphite sheet is, for example, heated so as to be carbonized. In this manner, a metal layer is formed on the lower surface of the graphite sheet with the carbonized layer interposed therebetween. Next, the graphite sheet is disposed so that the metal layer comes into contact with the mounting face 11a and thus crimped onto the mounting face 11a. In this way, the graphite sheet can be surely adhered to the mounting face.

Alternatively, the graphite sheet may be adhered to the mounting face by using solder without being crimped thereon. More specifically, a metal (such as Ti or Co) that can form a carbonized layer and a metal layer made of a metal (such as Al or Cu) that is likely to match solder is initially evaporated onto the lower surface of the graphite sheet, and the interface between the evaporated metal and the graphite sheet is carbonized to form a carbonized layer. Thereafter, a solder layer may be disposed on the top surface of the metal layer, and the graphite sheet may be disposed so that the solder layer comes into contact with the mounting face 11a.

Figure 3B:
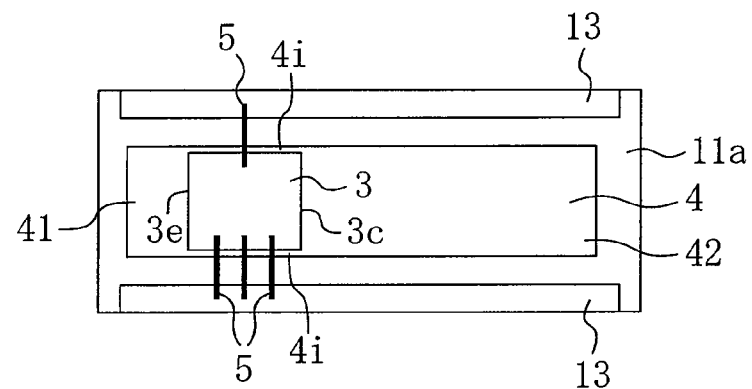

Next, as shown in FIG. 3(b), a semiconductor device 3 is mounted on the first part of the thermally-conductive sheet member 4 (step (b)). In this case, the semiconductor device 3 is mounted so that its third side surface 3e is located closer to one end 41 of the thermally-conductive sheet member 4 than its first side surface 3c.

Subsequently, the semiconductor device 3 is electrically connected through conductive wires 5, 5, . . . to electrode terminals 13 disposed on the heat sink 1. In this case, the conductive wires 5, 5, . . . are disposed across parts 4i, 4i of the thermally-conductive sheet member 4 located in the vicinity of second and fourth side surfaces of the semiconductor device 3.

Figure 3C:
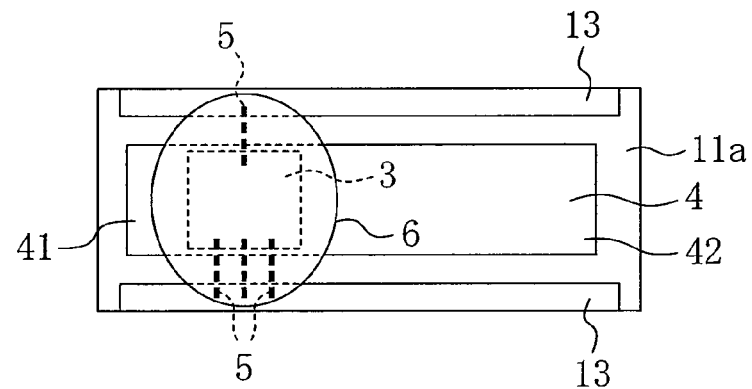

Then, as shown in FIG. 3(c), an insulating member 6 is injected onto the top surface 3a of the semiconductor device 3 to cover the top surface 3a. In this case, the insulating member 6 is preferably injected to cover not only the top surface 3a of the semiconductor device 3 but also the conductive wires 5, 5, . . . .

Figure 3D:
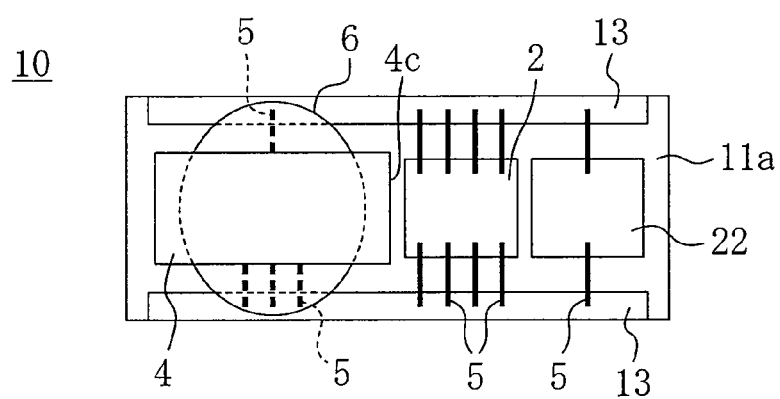

Thereafter, as shown in FIG. 3(d), the other end 42 of the thermally-conductive sheet member 4 is lifted, and the thermally-conductive sheet member 4 is bent so that the other end 42 is located above the one end 41 (step (c)). In this case, the other end 42 of the thermally-conductive sheet member 4 is preferably prevented from being in contact with the one end 41. Thus, a second part of the thermally-conductive sheet member 4 (in this embodiment, a side part 4c thereof) covers the first side surface 3c of the semiconductor device 3. Then, an electronic component 2 is mounted across the side part 4c of the thermally-conductive sheet member 4 from the semiconductor device 3 (step (d)). Furthermore, an electronic component 22 is mounted across the electronic component 2 from the semiconductor device 3. Then, the electronic components 2 and 22 are electrically connected through the conductive wires 5, 5, . . . to the electrode terminals 13 disposed on the heat sink 1. In the above-described manner, the semiconductor module 10 shown in FIG. 1 can be fabricated.

Figure 23:
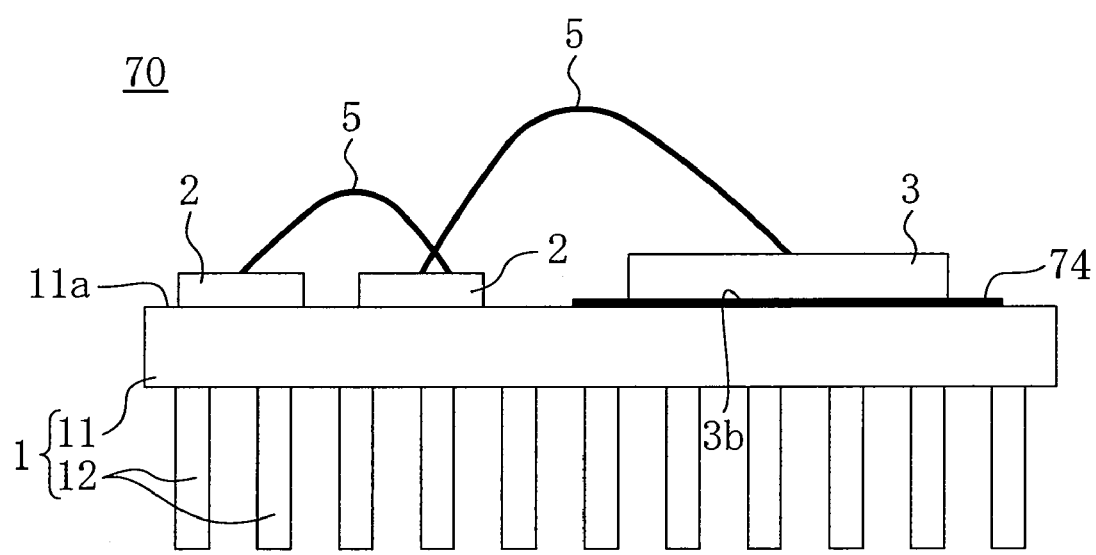
FIG. 23 is a side view showing the configuration of a semiconductor module of a reference example.
Figure 24A:
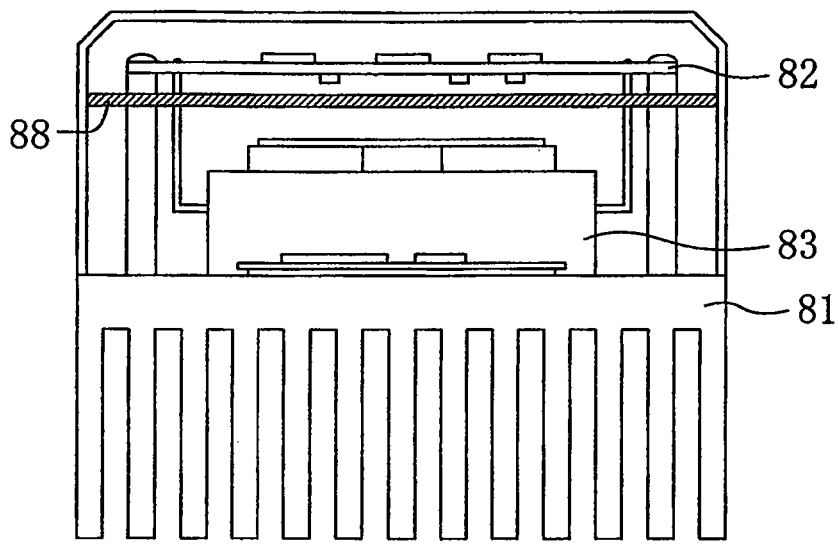
FIG. 24(a) is a cross-sectional view showing the configuration of a known semiconductor module.
Figure 24B:
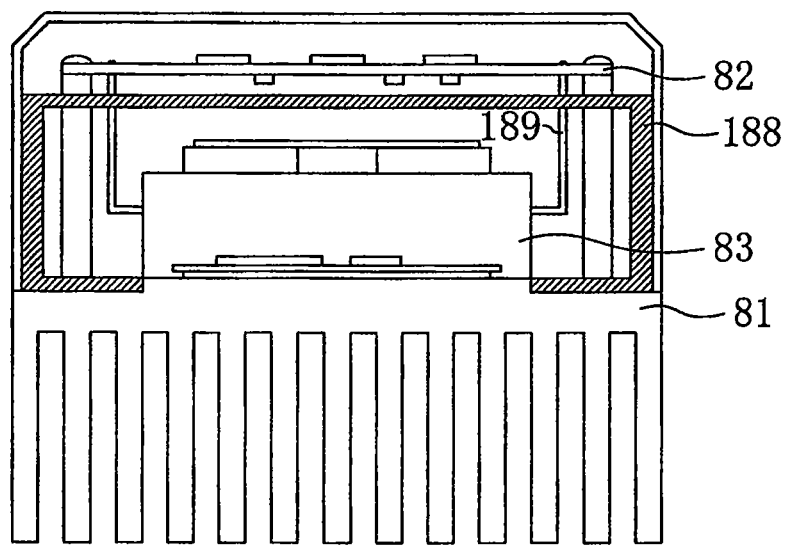
FIG. 24(b) is a cross-sectional view showing the configuration of another known semiconductor module.

The semiconductor module 10 of this embodiment will be described hereinafter while being compared to a known semiconductor module that does not include a thermally-conductive sheet member and a semiconductor module 70 illustrated in FIG. 23 (hereinafter, referred to as a "semiconductor module of a reference example"). Furthermore, a description will be given of the difference between the case where a Si device is used as a semiconductor device and the case where a wide band gap semiconductor device is used thereas. First, the advantages of the semiconductor module 10 of this embodiment will be described.

For the known semiconductor module, heat generated by a semiconductor device is spread and transmitted to the vicinity of the semiconductor device. Therefore, when an electronic component is mounted in the vicinity of the semiconductor device, this situation causes a rise in the temperature of the electronic component. It is considered that in order to prevent the rise in the temperature of the electronic component, the electronic component is placed away from the semiconductor device long enough to prevent the heat generated by the semiconductor device from being transmitted to the electronic component. However, when the electronic component is placed in the above-mentioned manner, this placement causes an increase in the size of the semiconductor module. Furthermore, on condition that the semiconductor device and the electronic component are electrically connected through a conductive wire to each other, if the electronic component is placed sufficiently away from the semiconductor device, the conductive wire becomes long so that considerably large resistance is produced on the conductive wire. As a result, a loss is generated in the conductive wire.

Alternatively, it may be considered that an electronic component resistant to high temperatures is mounted on the assumption that the semiconductor device generates heat. However, when an electronic component satisfying high-temperature specifications is mounted, this situation prevents the cost of the semiconductor module from being reduced.

For the semiconductor module 70 of the reference example, a thermally-conductive sheet member 74 is disposed only between a mounting face 11a of a heat sink 1 and the bottom surface 3b of a semiconductor device 3. In this case, heat from the heat sink 1 (heat of cooling) is transmitted to the semiconductor device 3. Accordingly, when the surface area of the thermally-conductive sheet member 74 is sufficiently larger than the area of the bottom surface 3b of the semiconductor device 3, this situation can suppress a temperature rise arising from heat generated by the semiconductor device 3. However, like the known semiconductor module, the heat generated by the semiconductor device 3 is spread and conveyed.

As seen from the above, use of the known semiconductor module or the semiconductor module 70 of the reference example causes a rise in the temperature of an electronic component placed in the vicinity of a semiconductor device, causes increases in the size and cost of the semiconductor module in an attempt to avoid the above temperature rise, and produces a loss in a lengthened conductive wire.

On the other hand, for the semiconductor module 10 of this embodiment, the thermally-conductive sheet member 4 achieves efficient heat isolation as described above. This heat isolation can suppress a rise in the temperature of the vicinity of the semiconductor device 3. Therefore, the electronic components 2 and 22 do not need to be mounted sufficiently away from the semiconductor device 3. This situation can reduce the size of the semiconductor module 10 and further reduce the lengths of the conductive wires 5, 5, . . . . The reduction in the lengths of the conductive wires 5, 5, . . . can prevent losses from being produced in the conductive wires 5, 5, . . . .

Furthermore, since any electronic component satisfying high-temperature specifications does not need to be used, the cost of the semiconductor module 10 can be reduced.

Next, a description will be given of the advantages of the use of a wide band gap semiconductor device as a semiconductor device.

The thermal conductivity of Si is not so large. Accordingly, when a Si device is used as a semiconductor device, a semiconductor module is preferably thermally designed so that heat generated by the Si device (heat which, when current is allowed to flow through the Si device during operation, is generated by the Si device) is allowed to efficiently escape. Furthermore, disadvantageously, when the Si device has a temperature of 150° C. or more, its semiconductor properties are weakened, and the Si device does not function as a current control device. Therefore, a semiconductor module is preferably thermally designed so that the temperature of a part of the semiconductor module having the highest current density does not exceed 150° C. More specifically, when the current density of the inside of the Si device during operation is $10 \times 10^4$ A/m$^2$ or more, heat generated by the Si device needs to be taken into account. In particular, when the current density of the inside of the Si device during operation is $50 \times 10^4$ A/m$^2$ or more, the generated heat from the Si device becomes significant so that the semiconductor module needs to be thermally designed in the above-mentioned manner.

In other words, when a Si device is used as a semiconductor device, a heat release path through which heat releases must be considered in the thermal design, and the Si device needs to be brought into reliable contact with a heat sink serving as the heat release path. More specifically, the Si device is bonded directly to a package base material through soldering or the like by a method designated as die bonding. Therefore, for a semiconductor module including a plurality of Si devices, the plurality of Si devices are two-dimensionally placed on a mounting face 11a of the package base material without being stacked one on another and are thereby prevented from overlapping one another. In view of the above, the area of the mounting face 11a of the package base material is increased, resulting in an increase in the size of the semiconductor module.

In summary, the use of a Si device as a semiconductor device increases the amount of heat generated due to losses during operation of a Si-IGBT (insulated gate bipolar transistor) as well as a Si-MOSFET under the condition that the current density of the Si device is $50 \times 10^4$ A/m$^2$ or more. Therefore, it is difficult to continue operating a semiconductor module while keeping the temperature of the Si device at the maximum temperature at which the Si device is operable, i.e., approximately 150° C. Herein, the Si-MOSFET is a MOSFET formed using Si as a semiconductor material, and the Si-IGBT is an IGBT formed using Si as a semiconductor material.

The electrical resistance of a Si-IGBT can be made one or more orders of magnitude smaller than that of a Si-MOSFET. However, the electrical resistance of an IGBT is reduced with a temperature rise. Accordingly, when an IGBT is operated at a constant voltage, the amount of current flowing through a semiconductor device is increased, leading to further increase in the amount of heat generated in the IGBT. This situation causes thermal runaway, and thus, in some cases, this thermal runaway may lead to a breakdown in the IGBT. The cause of this breakdown is observed as current crowding inside a single Si-IGBT or current crowding to one of a plurality of parallel-connected Si-IGBTs.

On the other hand, on condition that a wide band gap semiconductor device is used as a semiconductor device, if the size of the wide band gap semiconductor device is reduced in order to reduce the size of a semiconductor module, this situation increases the current density of the wide band gap semiconductor device. As a result, the amount of heat generated in the wide band gap semiconductor device is increased. Even in such a case, when the wide band gap semiconductor device is partially covered with the thermally-conductive sheet member 4 of this embodiment, efficient heat isolation can be achieved. In summary, the present invention is effective particularly when a wide band gap semiconductor device is reduced in size.

More particularly, a reduction in the size of a wide band gap semiconductor device increases the amount of heat generated by the wide band gap semiconductor device. For a known semiconductor module that does not have any thermally-conductive sheet member, on condition that an associated wide band gap semiconductor device is reduced in size, unless an associated electronic component is placed further away from the wide band gap semiconductor device, heat from the wide band gap semiconductor device is transmitted to the electronic component. In view of the above, even if, for the known semiconductor module, the wide band gap semiconductor device is reduced in size in order to reduce the size of the semiconductor module, the module will be increased in size.

Meanwhile, for the semiconductor module of this embodiment, on condition that an associated wide band gap semiconductor device is reduced in size, even if an associated electronic component is mounted near the wide band gap semiconductor device, heat from the wide band gap semiconductor device is not transmitted to the associated electronic component. In view of the above, for the semiconductor module of this embodiment, also when the wide band gap semiconductor device is reduced in size, the electronic component can be mounted near the semiconductor device, resulting in a reduction in the size of the semiconductor module.

Furthermore, when a wide band gap semiconductor device is used as a semiconductor device, the thermal conductivity of the wide band gap semiconductor is several times as large as that of Si. For example, silicon carbide (SiC) has a thermal conductivity of approximately 490 W/(m·K), and diamond has a thermal conductivity of approximately 2000 W/(m·K). Owing to such high thermal conductivities, the efficiency in releasing heat from the semiconductor device is high, and therefore, the temperature of a part of the semiconductor device with a high current density can be kept from increasing.

The use of a MOSFET formed using a wide band gap semiconductor device as a semiconductor device and having a breakdown voltage of approximately 1 kV can achieve a power loss one or more orders of magnitude smaller than the use of a MOSFET formed using a Si device as a semiconductor device and having the same breakdown voltage and achieve a power loss equal to or less than half of the power loss in the use of an IGBT formed using a Si device as a semiconductor device and having the same breakdown voltage. Owing to the small power loss property of the wide band gap semiconductor device, the effect of reducing the amount of heat generated by the semiconductor device can be expected.

Furthermore, since the use of a MOSFET composed of a wide band gap semiconductor device as a semiconductor device can achieve a high breakdown voltage and small power loss property superior to the use of an IGBT composed of a Si device as a semiconductor device, the high speed operation property of the MOSFET can be usefully used for controlling a high voltage/large current. In other words, the use of the MOSFET composed of a wide band gap semiconductor device as a semiconductor device can reduce switching losses caused when the response speed of a semiconductor device is low relative to the switching time of the semiconductor device.

Moreover, when a MOSFET is formed using a wide band gap semiconductor device as a semiconductor device, heat generated by the semiconductor device can be reduced even under the condition that current flows through the semiconductor device at a current density of $50 \times 10^4$ A/m$^2$ or more. As a result, an associated semiconductor module can be satisfactorily operated. Hence, at least one of a plurality of semiconductor devices serving as active regions of a semiconductor module is preferably composed of a wide band gap semiconductor device. The so-constructed semiconductor module is preferably applied to cases where current flows through the semiconductor device at a current density of $50 \times 10^4$ A/m$^2$ or more.

Actually, the present inventor has recognized the following: More particularly, on condition that a MOSFET is formed using a wide band gap semiconductor device as a semiconductor device, when the wide band gap semiconductor device is operated at a current density of $50 \times 10^4$ A/m$^2$ or more so as to be kept at high temperatures, the degree of increase in the electrical resistance of the wide band gap semiconductor device becomes larger than that when the wide band gap semiconductor device is kept at low temperatures. In general, a MOSFET is often operated at a constant voltage. Therefore, when the temperature of a wide band gap semiconductor device becomes high so that its electrical resistance increases, the amount of current flowing through the wide band gap semiconductor device is reduced. This reduction leads to a reduction in the amount of heat generated in the MOSFET. This reduction in the heat amount prevents a breakdown in the MOSFET due to thermal runaway, which has been problematic in the use of the above-mentioned Si-IGBT. Even if the temperature of the wide band gap semiconductor device is increased to 200° C. or more (further 400° C. or more) by the heat generation, the MOSFET can be satisfactorily operated with stability.

Furthermore, the present inventor has recognized that as long as a semiconductor device is a semiconductor device made of silicon carbide (in particular, 4H—SiC), such a semiconductor device made of silicon carbide is more excellent in terms of the low-loss property, stability, reliability and other properties than other wide band gap semiconductor devices. The present inventor has considered that the reason for this is that wafers with a low defect density are supplied and hence, there minimally arises a problem of dielectric breakdown or the like derived from a defect caused in a crystal.

Effects achieved by the semiconductor module 10 of this embodiment will be described below together.

Since the semiconductor module 10 of this embodiment allows efficient heat isolation, the electronic component 2 can be mounted near the semiconductor device 3 as compared with a known module. Therefore, the size of the module can be reduced, furthermore the cost thereof can be reduced, and the performance thereof can be improved.

More specifically, since the thermally-conductive sheet member 4 has the lower part 4b, it can be kept at substantially the same temperature as the heat sink 1 even when the temperature of the semiconductor device 3 is high due to the operation of the semiconductor module 10. Since the thermally-conductive sheet member 4 has the side part 4c, this situation can suppress the heat transmission to the electronic components 2 and 22. Since the thermally-conductive sheet member 4 has the upper part 4a, this situation permits not only the heat isolation but also the absorption of electromagnetic noise. More particularly, even when the thermally-conductive sheet member 4 does not have the upper part 4a, heat isolation can be achieved. However, when the thermally-conductive sheet member 4 has the upper part 4a, this situation permits more efficient heat isolation and the absorption of electromagnetic noise. In view of the above, the thermally-conductive sheet member 4 may form any one of the shapes described below in first and second variants.

Furthermore, since the conductive wires 5, 5, . . . can be placed to pass through the region 4d between the upper part 4a and lower part 4b of the thermally-conductive sheet member 4, the conductive wires 5, 5, . . . can be easily routed in a short time. As a result, the manufacturing time for the semiconductor module 10 can be reduced, and the production cost of the semiconductor module 10 can be reduced.

In this embodiment, the thermally-conductive sheet member only needs to be bent so that a certain part (first part) of the thermally-conductive sheet member becomes close to another part (second part) thereof. For example, the thermally-conductive sheet member may be bent so that one transverse end of the thermally-conductive sheet member becomes close to the other transverse end thereof. Alternatively, the thermally-conductive sheet member may be bent so that one longitudinal end of the thermally-conductive sheet member becomes close to a longitudinally middle part thereof.

(First Variant)

Figure 4:
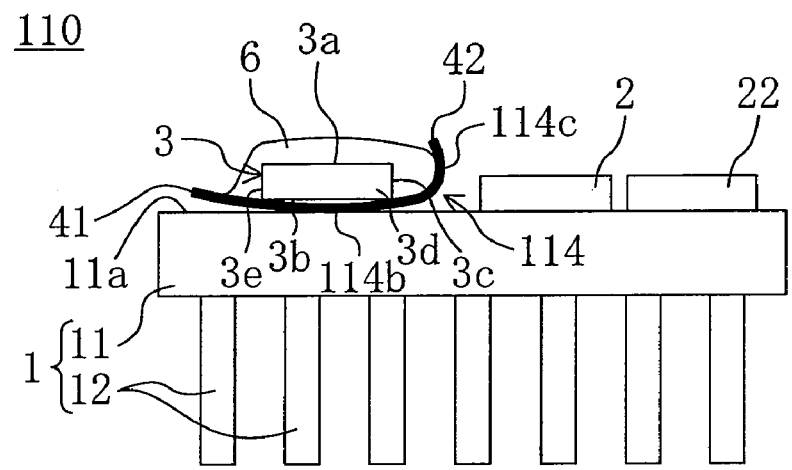
FIG. 4 is a side view showing the configuration of a semiconductor module according to a first variant of the first embodiment of the present invention.

FIG. 4 is a side view showing the configuration of a semiconductor module 110 according to a first variant of the first embodiment. In this figure, conductive wires are not shown.

In this variant, a thermally-conductive sheet member 114 has a lower part 114b and a side part 114c but does not have an upper part. Even when, as described above, the thermally-conductive sheet member 114 does not have an upper part, the presence of the side part 114c can suppress the heat transmission to the electronic components 2 and 22 and allows heat isolation.

A fabrication method for the semiconductor module 110 according to this variant is substantially the same as the fabrication method described in the first embodiment. Meanwhile, in the step of bending the thermally-conductive sheet member 114, the thermally-conductive sheet member 114 is bent so that the lower part 114b is located on one end 41 side of the thermally-conductive sheet member 114 and the side part 114c is located on the other end 42 side thereof.

(Second Variant)

Figure 5:
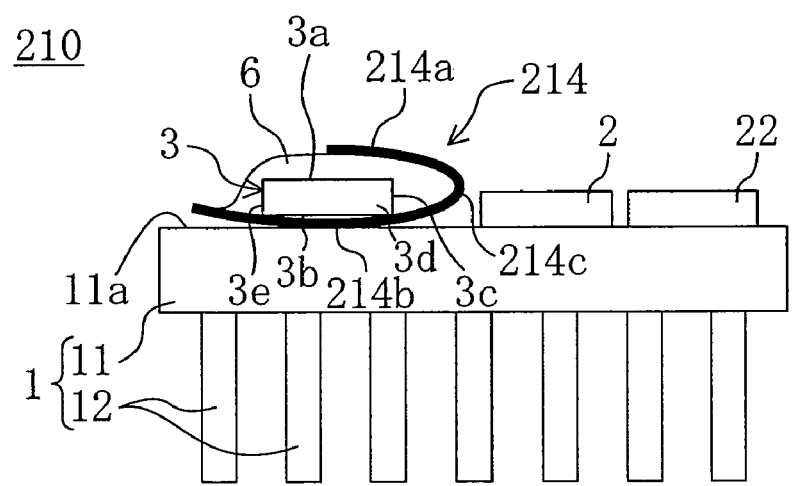
FIG. 5 is a side view showing the configuration of a semiconductor module according to a second variant of the first embodiment of the present invention.

FIG. 5 is a side view showing the configuration of a semiconductor module 210 according to a second variant of the first embodiment. In this figure, conductive wires are not shown.

In this variant, a thermally-conductive sheet member 214 has an upper part 214a, a lower part 214b and a side part 214c as described in the first embodiment. However, the upper part 214a does not entirely cover the top surface 3a of a semiconductor device 3. Even when, as described above, the thermally-conductive sheet member 214 does not entirely cover the top surface 3a of the semiconductor device 3, heat isolation can be achieved.

A fabrication method for the semiconductor module 210 of this variant is substantially the same as the fabrication method described in the first embodiment. Meanwhile, in the step of bending the thermally-conductive sheet member 214, the thermally-conductive sheet member 214 is bent so that the lower part 214b is located on one end side of the thermally-conductive sheet member 214 and the upper part 214a is located on the other end side thereof.

Embodiment 2 of the Invention

Figure 6:
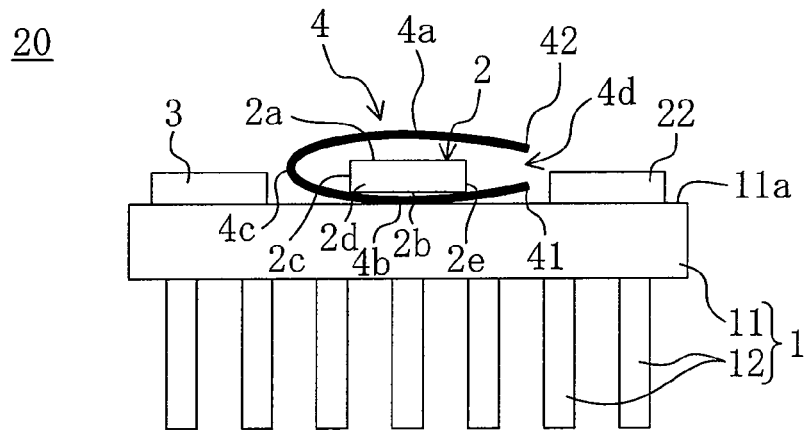
FIG. 6 is a side view showing the configuration of a semiconductor module according to a second embodiment of the present invention.

FIG. 6 is a side view showing the configuration of a semiconductor module 20 according to a second embodiment. In this figure, conductive wires are not shown.

In this embodiment, unlike the first embodiment, a target component is an electronic component 2, and the other component different from the target component is a semiconductor device 3. In other words, a thermally-conductive sheet member 4 covers not the semiconductor device 3 but part of the electronic component 2. This situation will be more specifically described below.

Like the first embodiment, the thermally-conductive sheet member 4 has an upper part 4a, a lower part 4b and a side part 4c. The upper part 4a covers the top surface 2a of the electronic component 2. The lower part 4b is interposed between the bottom surface 2b of the electronic component 2 and a mounting face 11a. Like the first embodiment, the surface area of the lower part 4b is ⅕ or more of the surface area of the thermally-conductive sheet member 4. The side part 4c covers a first side surface 2c of the electronic component 2. The semiconductor device 3 is mounted across the side part 4c of the thermally-conductive sheet member 4 from the electronic component 2. An electronic component 22 is mounted across the electronic component 2 from the semiconductor device 3.

Like the first embodiment, the upper part 4a is not in contact with the lower part 4b. Therefore, holes through which conductive wires are to pass do not need to be formed in the thermally-conductive sheet member 4.

For the semiconductor module 20 of this embodiment, the semiconductor device 3 is not covered with the thermally-conductive sheet member 4. Therefore, heat generated by the semiconductor device 3 is spread and transmitted to the vicinity of the semiconductor device 3. However, since the electronic component 2 is partially covered with the thermally-conductive sheet member 4 and, like the first embodiment, the surface area of the lower part 4b is ⅕ or more of the surface area of the thermally-conductive sheet member 4, heat of a heat sink (heat of cooling) can be efficiently transmitted to the entire thermally-conductive sheet member 4. Hence, heat generated by the semiconductor device 3 can be prevented from being transmitted to the electronic component 2. Furthermore, since the electronic component 22 is mounted across the electronic component 2 from the semiconductor device 3, heat generated by the semiconductor device 3 can be prevented from being transmitted to the electronic component 22. In other words, the semiconductor module 20 of this embodiment can also achieve efficient heat isolation.

A fabrication method for the semiconductor module 20 of this embodiment is substantially the same as the fabrication method for the semiconductor module 10 described in the first embodiment. However, in the step shown in FIG. 3(b) in the first embodiment, not the semiconductor device 3 but the electronic component 2 is placed near one end 41 of the thermally-conductive sheet member 4, and in the step shown in FIG. 3(c), no insulating member is provided. Furthermore, in the step shown in FIG. 3(d), the thermally-conductive sheet member 4 is bent so that the other end 42 is located above the one end 41. Thereafter, the semiconductor device 3 is mounted across the side part 4c of the thermally-conductive sheet member 4 from the electronic component 2.

As described above, the semiconductor module 20 of this embodiment provides substantially the same effects as the semiconductor module 10 of the first embodiment.

The semiconductor module of this embodiment may be configured as follows.

In the case where, as in this embodiment, the electronic component 2 is a target component, a heat sink 1 does not need to have such excellent cooling capacity. On the other hand, in the case where, as in the first embodiment, the heat-generating semiconductor device 3 is a target component, the heat sink 1 preferably has excellent cooling capacity. In a case where a heat sink made of a metal is used as the heat sink 1, the heat sink 1 preferably has a large thermal conductivity.

Furthermore, the semiconductor module of this embodiment does not need to include an insulating member as shown in FIG. 6. The reason for this is as follows. In many cases, no electrode is disposed on the top surface of an electronic component, and therefore even with contact between a part of a thermally-conductive sheet member and the top surface of the electronic component, the possibility of causing a short circuit at the location of the contact is extremely low. It is needless to say that, as in the first embodiment, an insulating member may be interposed between the part of the thermally-conductive sheet member and the top surface of the electronic component.

In addition, a thermally-conductive sheet member does not need to have an upper part as shown in FIG. 4 in the first embodiment and may cover part of the top surface of an electronic component as shown in FIG. 5 in the first embodiment.

Embodiment 3 of the Invention

Figure 7A:
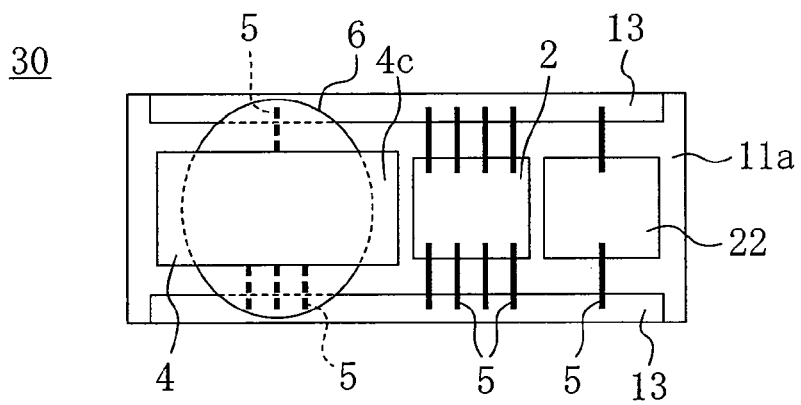
FIG. 7(a) is a top view showing the configuration of a semiconductor module according to a third embodiment of the present invention.
Figure 7B:
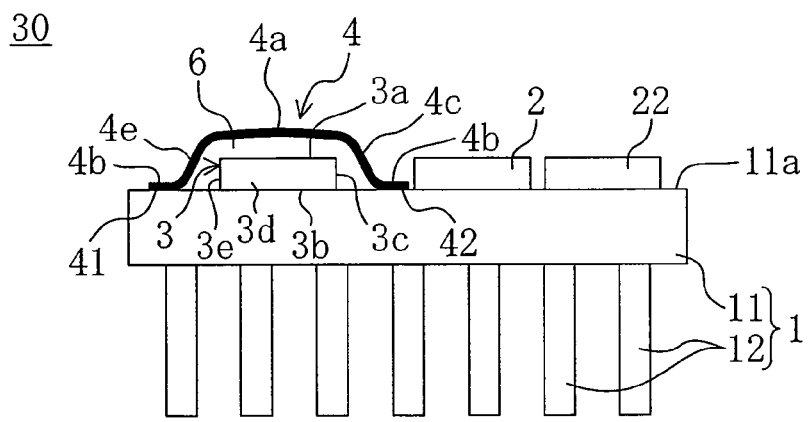
FIG. 7(b) is a side view thereof.
Figure 8:
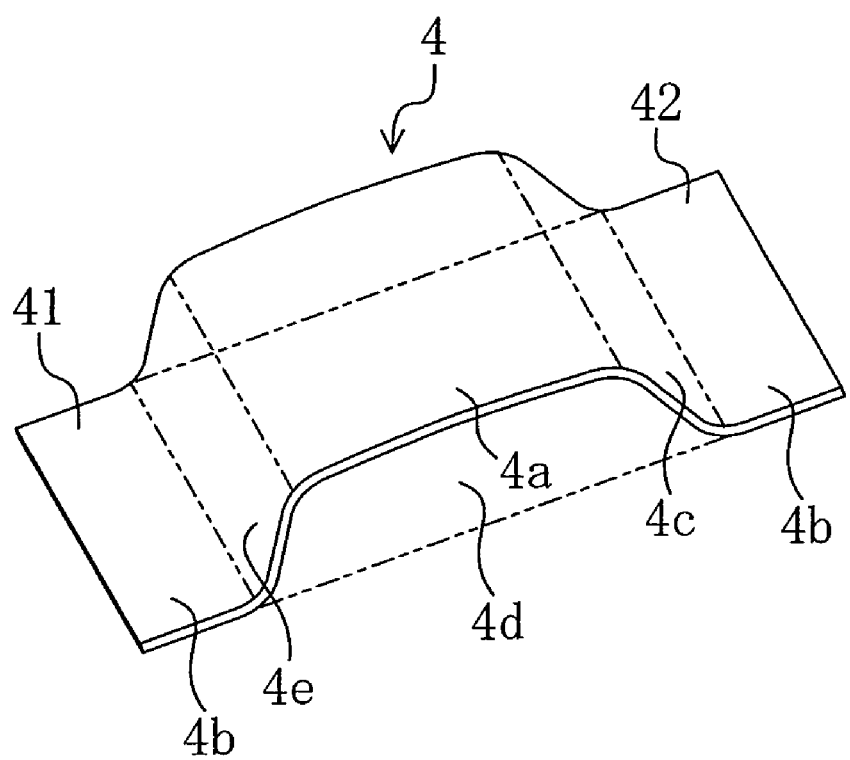
FIG. 8 is a perspective view of a thermally-conductive sheet member according to the third embodiment of the present invention.

FIG. 7 are schematic diagrams of a semiconductor module 30 according to a third embodiment, in which FIG. 7(a) is a top view thereof and FIG. 7(b) is a side view thereof. In these figures, conductive wires are not shown. FIG. 8 is a perspective view of a thermally-conductive sheet member 4 according to this embodiment.

In this embodiment, the thermally-conductive sheet member 4 covers part of a semiconductor device 3 as in the first embodiment. However, the thermally-conductive sheet member 4 covers not only a first side surface 3c of the semiconductor device 3 but also a third side surface 3e thereof. The thermally-conductive sheet member 4 of this embodiment will be specifically described below.

The thermally-conductive sheet member 4 of this embodiment covers part of the semiconductor device 3 from above so that a part of the thermally-conductive sheet member 4 located on one end 41 side thereof and a part thereof located on the other end 42 side are in contact with a mounting face 11a, and the thermally-conductive sheet member 4 has an upper part 4a, a lower part 4b, another lower part 4b, a side part 4c, and a second side part 4e. The upper part 4a is located in the longitudinal middle of the thermally-conductive sheet member 4 and covers the top surface 3a of the semiconductor device 3 as in the first embodiment. The lower parts 4b and 4b are disposed on parts of the mounting face located to the outside of the semiconductor device 3, one being located on the one end 41 side of the thermally-conductive sheet member 4 and the other being located on the other end 42 side thereof. The side part 4c and the second side part 4e are located between the upper part 4a and the lower parts 4b and 4b as in the first embodiment. The side part 4c covers the first side surface 3c of the semiconductor device 3, and the second side part 4e covers the third side surface 3e of the semiconductor device 3. In view of the above, heat of a heat sink 1 (heat of cooling) is initially transmitted to the lower parts 4b and 4b, subsequently the transmitted heat is transmitted to the side part 4c and the second side part 4e, and then the heat transmitted to the side part 4c and the second side part 4e is transmitted to the upper part 4a. In this manner, heat is transmitted to the entire thermally-conductive sheet member 4. In other words, the heat of the heat sink 1 is transmitted through the one end 41 and the other end 42 of the thermally-conductive sheet member 4 to the longitudinal middle thereof.

For the thermally-conductive sheet member 4 of this embodiment, the sum total of the surface areas of the two lower parts 4b and 4b is preferably ⅕ or more of the entire surface area of the thermally-conductive sheet member 4 as in the first embodiment.

The upper part 4a is located away from the mounting face 11a, and thus conductive wires 5, 5, . . . are disposed to pass through the region 4d between the upper part 4a and the mounting face 11a. Therefore, as in the first embodiment, the conductive wires 5, 5, . . . can be provided without forming holes in the thermally-conductive sheet member 4.

The upper part 4a of the thermally-conductive sheet member 4 is not in contact with the mounting face 11a at the front and back of the upper part 4a when seen in FIG. 7(b). However, for example, in a case where the conductive wires 5, 5, . . . are placed only toward the front, the upper part 4a of the thermally-conductive sheet member 4 may be in contact with the mounting face 11a at the back of the upper part 4a in FIG. 7(b). The thermally-conductive sheet member 4 only needs to be bent while being prevented from being in contact with the conductive wires 5, 5, . . . .

Figure 9A:
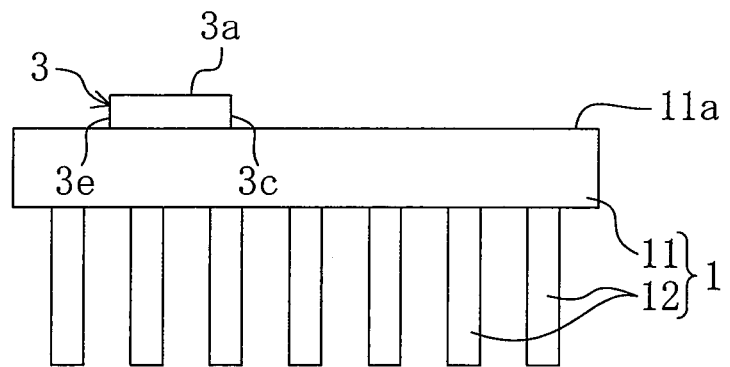
FIGS. 9(a) through 9(c) are side views showing a fabrication method for a semiconductor module according to the third embodiment of the present invention.
Figure 9B:
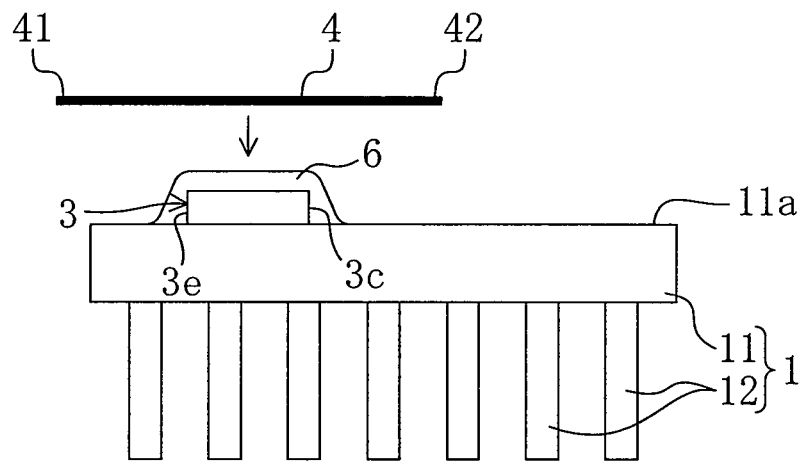
Figure 9C:
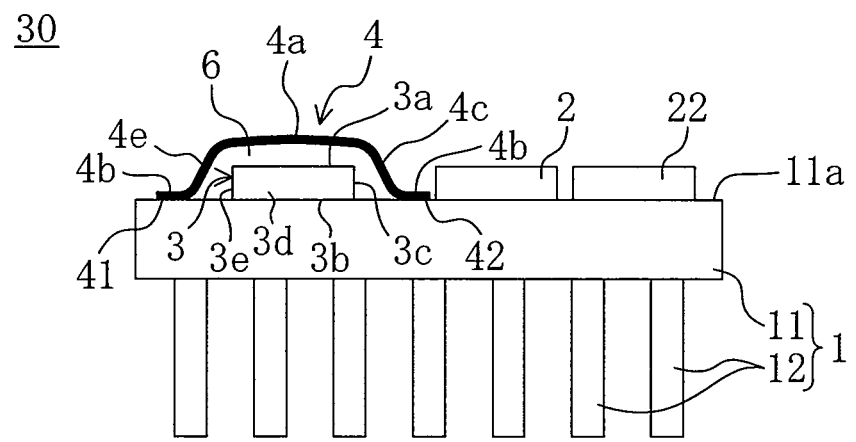

FIGS. 9(a) through 9(c) are side views showing a fabrication method for the semiconductor module 30 of this embodiment.

First, as shown in FIG. 9(a), a semiconductor device 3 is fixed on a mounting face 11a of a heat sink 1 using a conductive adhesive, such as solder (step (a)). Thereafter, electrode terminals (not shown) disposed on the heat sink 1 are electrically connected through conductive wires (not shown) to the semiconductor device 3.

Next, as shown in FIG. 9(b), an insulating member 6 is injected onto the top surface 3a of the semiconductor device 3 to cover the top surface 3a and the conductive wires. Thereafter, the thermally-conductive sheet member 4 is brought near the insulating member 6 in the direction shown by the arrow in FIG. 9(b) to cover the insulating member 6 from above (step (b)).

In this step, while parts of the thermally-conductive sheet member 4 located on one end 41 side thereof and the other end 42 side thereof are brought into contact with the mounting face 11a, the entire thermally-conductive sheet member 4 is prevented from being in contact with the conductive wires (not shown). Parts of the thermally-conductive sheet member 4 located on the one end 41 side and the other end 42 side are preferably adhered to the mounting face 11a by using the adhesion method described in the first embodiment.

As described in the first embodiment and any other embodiment or variant, the thermally-conductive sheet member 4 covers the insulating member 6 from above in order that the area of part (first part) of the thermally-conductive sheet member 4 coming into contact with the mounting face 11a becomes ⅕ or more of the surface area of the thermally-conductive sheet member 4.

Thereafter, as shown in FIG. 9(c), an electronic component 2 is mounted across a side part 4c of the thermally-conductive sheet member 4 from the semiconductor device 3 (step (c)). Furthermore, an electronic component 22 is mounted across the electronic component 2 from the semiconductor device 3. The electronic components 2 and 22 are electrically connected through conductive wires (not shown) to the electrode terminals (not shown) disposed on the heat sink 1. In the above-mentioned manner, the semiconductor module 30 shown in FIG. 7 can be fabricated.

Such a semiconductor module 30 can prevent the temperature of the thermally-conductive sheet member 4 from rising due to heat generated by the semiconductor device 3 like the semiconductor module 10 of the first embodiment. This prevention permits efficient heat isolation.

As described in the first embodiment, even when a thermally-conductive sheet member does not have an upper part, a semiconductor module can achieve efficient heat isolation. Therefore, a thermally-conductive sheet member may be configured as described in the following variants.

(First Variant)

Figure 10:
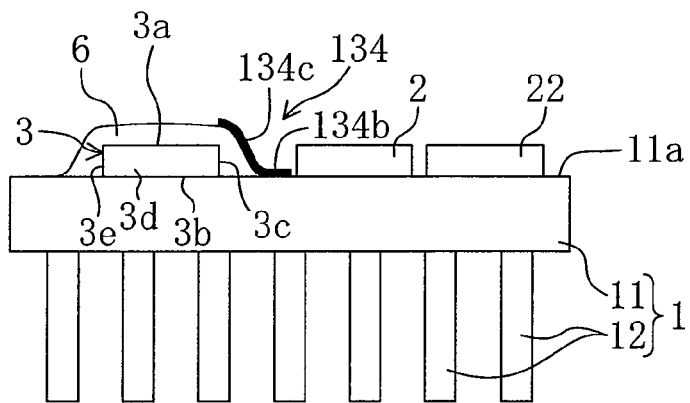
FIG. 10 is a side view showing the configuration of a semiconductor module according to a first variant of the third embodiment of the present invention.

FIG. 10 is a side view showing the configuration of a semiconductor module 130 according to a first variant of the third embodiment. In this figure, conductive wires are not shown.

In this variant, a thermally-conductive sheet member 134 has a lower part 134b and a side part 134c. The side part 134c covers a first side surface 3c of a semiconductor device 3, and the lower part 134b extends from the side part 134c. Furthermore, an electronic component 2 is mounted across the side part 134c from the semiconductor device 3. Since, as described above, the thermally-conductive sheet member 134 does not have an upper part but has the side part 134c, efficient heat isolation can be achieved.

A fabrication method for the semiconductor module 130 of this variant is substantially the same as the fabrication method described in the third embodiment. However, in the step of bending the thermally-conductive sheet member 134, the thermally-conductive sheet member 134 is bent so that one end part of the thermally-conductive sheet member 134 becomes the lower part 134b and the other end part thereof becomes the side part 134c.

(Second Variant)

Figure 11:
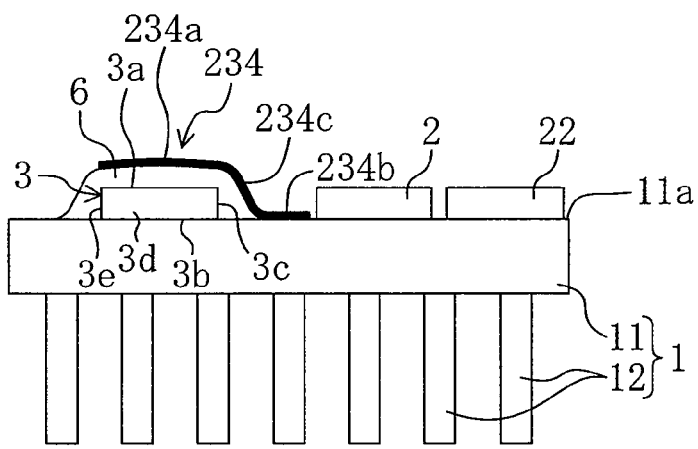
FIG. 11 is a side view showing the configuration of a semiconductor module according to a second variant of the third embodiment of the present invention.

FIG. 11 is a side view showing the configuration of a semiconductor module 230 according to a second variant of the third embodiment. In this figure, conductive wires are not shown.

In this variant, a thermally-conductive sheet member 234 has an upper part 234a, one lower part 234b and a side part 234c. The upper part 234a entirely covers the top surface 3a of a semiconductor device 3. The side part 234c extends from the upper part 234a to cover a first side surface 3c of the semiconductor device 3. The lower part 234b extends from the side part 234c and is in contact with a mounting face 11a. Even when, as described above, a third side surface 3e of the semiconductor device 3 is not covered with the thermally-conductive sheet member 234, the heat transmission to the electronic components 2 and 22 can be suppressed as long as the first side surface 3c of the semiconductor device 3 is covered with the thermally-conductive sheet member 234.

A fabrication method for the semiconductor module 230 of this variant is substantially the same as the fabrication method described in the third embodiment. However, in the step of bending the thermally-conductive sheet member 234, the thermally-conductive sheet member 234 is bent so that one end part of the thermally-conductive sheet member 234 becomes the lower part 234b and the other end part thereof becomes the upper part 234a.

(Third Variant)

Figure 12:
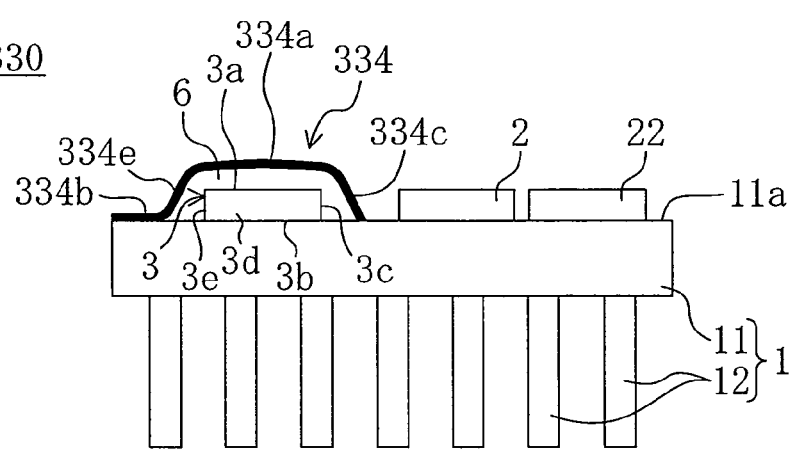
FIG. 12 is a side view showing the configuration of a semiconductor module according to a third variant of the third embodiment of the present invention.

FIG. 12 is a side view showing the configuration of a semiconductor module 330 according to a third variant of the third embodiment. In this figure, conductive wires are not shown.

In this variant, a thermally-conductive sheet member 334 has an upper part 334a, one lower part 334b, a side part 334c, and a second side part 334e. The upper part 334a entirely covers the top surface 3a of a semiconductor device 3. The side part 334c extends from the upper part 334a to cover a first side surface 3c of the semiconductor device 3. The second side part 334e extends from the upper part 334a to cover a third side surface 3e of the semiconductor device 3. The lower part 334b extends from the second side part 334e to come into contact with a mounting face 11a. In other words, the thermally-conductive sheet member 334 does not have a lower part extending from the side part 334c unlike the thermally-conductive sheet member 4 of the third embodiment. Even in such a case, as long as the surface area of the lower part 334b is ⅕ or more of the surface area of the thermally-conductive sheet member 334, heat of cooling from the heat sink 1 can be transmitted to the thermally-conductive sheet member 334. Therefore, efficient heat isolation can be achieved.

A fabrication method for the semiconductor module 330 of this variant is substantially the same as the fabrication method described in the third embodiment. However, in the step of bending the thermally-conductive sheet member 334, the thermally-conductive sheet member 334 is bent so that one end part of the thermally-conductive sheet member 334 becomes the side part 334c and the other end part thereof becomes the lower part 334b.

(Fourth Variant)

Figure 13:
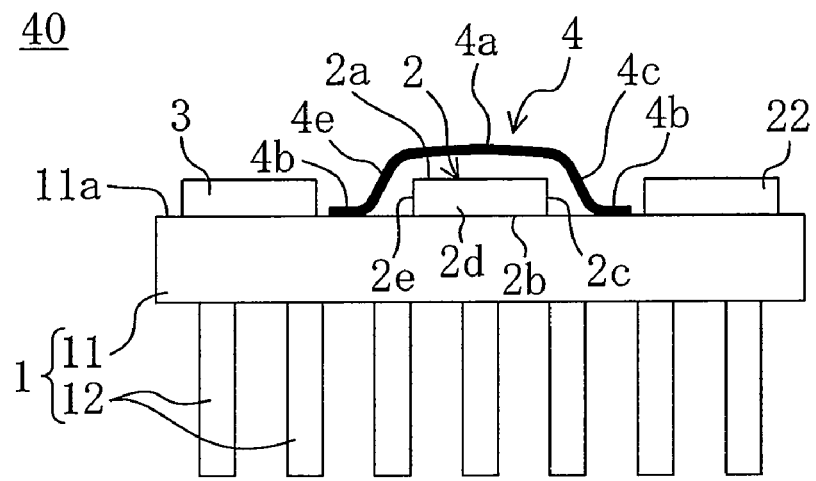
FIG. 13 is a side view showing the configuration of a semiconductor module according to a fourth variant of the third embodiment of the present invention.

FIG. 13 is a side view showing the configuration of a semiconductor module 40 according to a fourth variant of the third embodiment.

In this variant, a target component is an electronic component 2. The semiconductor module 40 is fabricated in accordance with substantially the same fabrication method as the fabrication method of the third embodiment, and thus, like the third embodiment, efficient heat isolation can be achieved.

When, as in this variant, a thermally-conductive sheet member 4 covers the electronic component 2, the shape of the thermally-conductive sheet member 4 may be any one of the shapes described in the first through third variants of the third embodiment.

Embodiment 4 of the Invention

Figure 14:
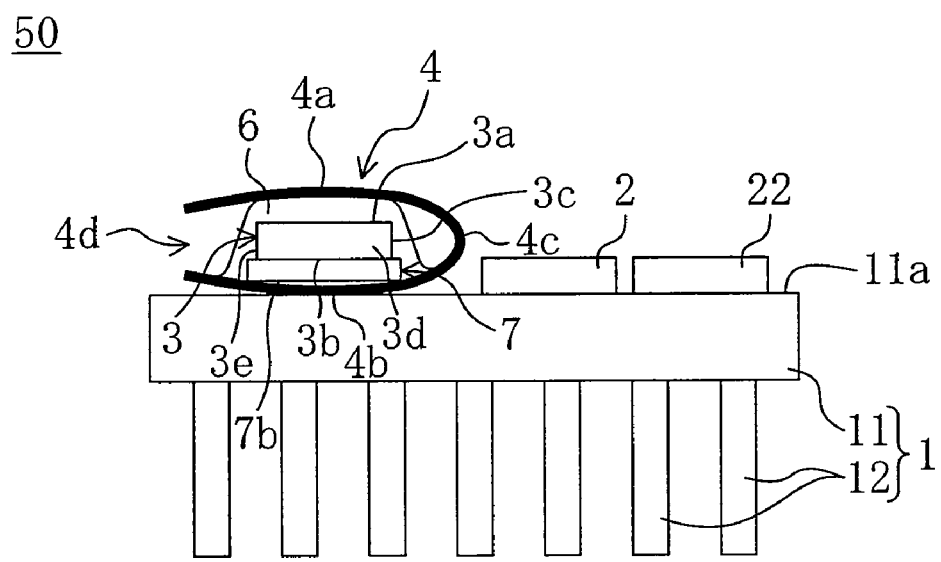
FIG. 14 is a side view showing the configuration of a semiconductor module according to a fourth embodiment of the present invention.

FIG. 14 is a schematic diagram of a semiconductor module 50 according to a fourth embodiment. In this figure, conductive wires are not shown.

Unlike the first embodiment, the semiconductor module 50 of this embodiment has a heat spreading plate 7. The heat spreading plate 7 will be specifically described below.

The heat spreading plate 7 of this embodiment is a plate made of, for example, GaN or $Al_2O_3$ and is disposed between the bottom surface 3b of a semiconductor device 3 and a lower part 4b of a thermally-conductive sheet member 4 to spread heat generated by the semiconductor device 3. Thus, the heat generated by the semiconductor device 3 can be spread over the heat spreading plate 7. This situation can prevent the temperature of the semiconductor device 3 from rising as compared with the first through third embodiments. Furthermore, while the thermally-conductive sheet member 4 is in contact with a mounting face 11a of a heat sink 1 and the bottom surface 7b of the heat spreading plate 7, it is not in direct contact with the semiconductor device 3. Therefore, as compared with the cases where, as in the first or third embodiment, the thermally-conductive sheet member 4 is in direct contact with the semiconductor device 3, even when the cooling capacity of the heat sink 1 is low, the temperature of the thermally-conductive sheet member 4 can be prevented from rising.

Furthermore, in a case where the heat spreading plate 7 is made of an insulating material (for example, GaN or $Al_2O_3$), an electrode disposed on the bottom surface 3b of the semiconductor device 3 can be electrically isolated from the thermally-conductive sheet member 4. As a result, the semiconductor device 3 and the heat sink 1 can be separately grounded. In view of the above, the semiconductor module 50 of this embodiment can achieve not only a heat-shielding effect but also a noise-shielding effect.

A fabrication method for the semiconductor module 50 of this embodiment is substantially the same as the fabrication method for the semiconductor module 10 of the first embodiment. However, in the step shown in FIG. 3(b), a heat spreading plate 7 is disposed on a part of a thermally-conductive sheet member 4 located on one end 41 side thereof, and a semiconductor device 3 is fixed on the heat spreading plate 7 using a conductive adhesive, such as solder.

The semiconductor module 50 of this embodiment may be configured as follows.

The semiconductor module 30 of the third embodiment may be provided with a heat spreading plate 7. In this case, the heat spreading plate 7 is preferably interposed between the bottom surface 3b of the semiconductor device 3 and the mounting face 11a. This situation allows heat generated by the semiconductor device 3 to be spread over the heat spreading plate 7 as described above and can suppress a rise in the temperature of the semiconductor device 3.

Furthermore, also when, as in the second embodiment and the fourth variant of the third embodiment, a target component is an electronic component 2, the heat spreading plate 7 may be interposed between the bottom surface 3b of the semiconductor device 3 and the mounting face 11a. In this manner, the heat generated by the semiconductor device 3 can be spread over the heat spreading plate 7. This situation can prevent the temperature of the semiconductor device 3 from rising as compared with the cases where, as in the second embodiment and the fourth variant of the third embodiment, no heat spreading plate 7 is provided.

Moreover, as described in the first variant (FIG. 4) of the first embodiment, a thermally-conductive sheet member does not need to have an upper part. As described in the second variant (FIG. 5) of the first embodiment, an upper part of a thermally-conductive sheet member may cover a part of the top surface of a semiconductor device. Furthermore, a thermally-conductive sheet member may form any one of the shapes described in the third embodiment and its variants.

Embodiment 5 of the Invention

Figure 15:
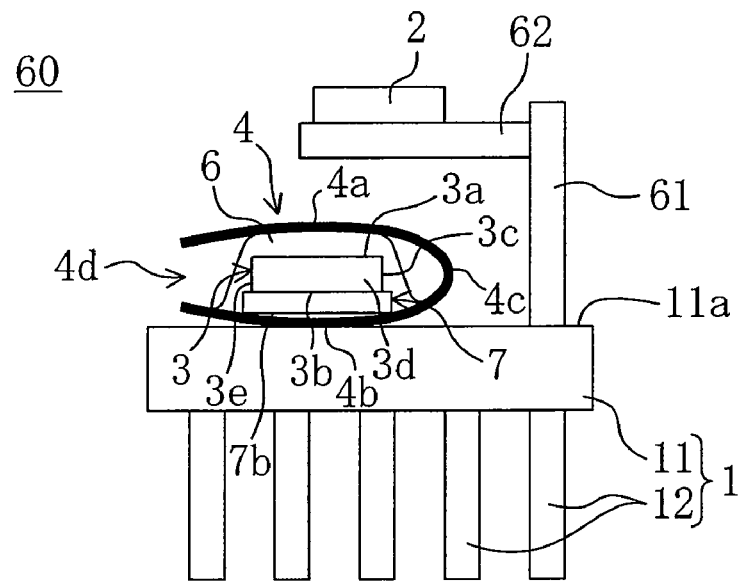
FIG. 15 is a side view showing the configuration of a semiconductor module according to a fifth embodiment of the present invention.

FIG. 15 is a schematic diagram of a semiconductor module 60 according to a fifth embodiment. In this figure, conductive wires are not shown.

The semiconductor module 60 of this embodiment is substantially the same as the semiconductor module 50 of the fourth embodiment. However, the relative spatial relationship between an electronic component 2 of the semiconductor module 60 and a semiconductor device 3 thereof is different from that between the electronic component 2 of the semiconductor module 50 and the semiconductor device 3 thereof. This difference will be specifically described below.

In the semiconductor module 60 of this embodiment, a support 61 is erected on a mounting face 11a of a heat sink 1, and a second board 62 is fixed to the support 61 to extend substantially in parallel to a board 11 of the heat sink 1. The electronic component 2 is mounted on the second board 62.

The support 61 and the second board 62 may be made of substantially the same material (metal) as the heat sink 1 and alternatively may be made of a different material (e.g., a resin) from the material of the heat sink 1. The reason for this is that since the electronic component 2 is mounted on the second board 62, the support 61 and the second board 62 do not need to have a cooling function.

The thermally-conductive sheet member 4 of this embodiment covers a part of the semiconductor device 3 as in the first through fourth embodiments. Therefore, efficient heat isolation can be achieved. This situation can keep heat from being transmitted to the electronic component 2 also when, as shown in FIG. 15, the electronic component 2 is placed above the semiconductor device 3.

The semiconductor module 60 of this embodiment can be fabricated in accordance with the fabrication method described in the first embodiment.

As described in the first through third embodiments, a semiconductor module does not have to include a heat spreading plate 7. The semiconductor module may be configured as described in the following variants.

(First Variant)

Figure 16:
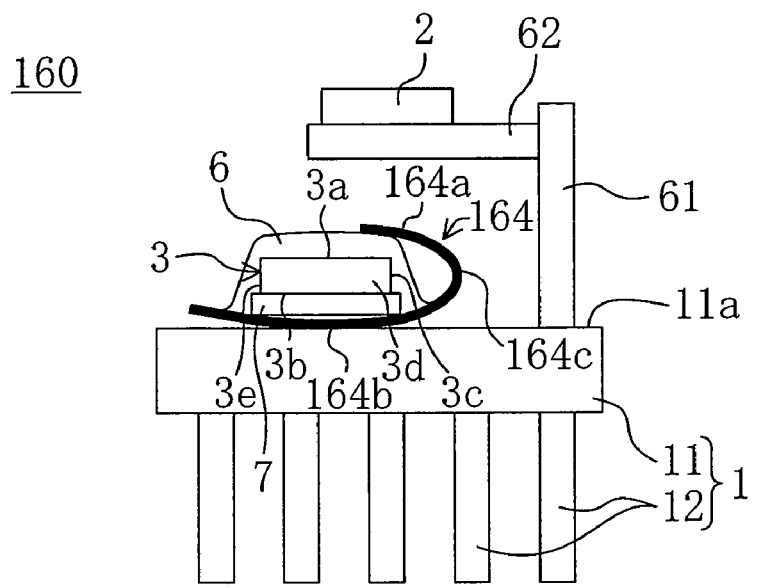
FIG. 16 is a side view showing the configuration of a semiconductor module according to a first variant of the fifth embodiment of the present invention.
Figure 17:
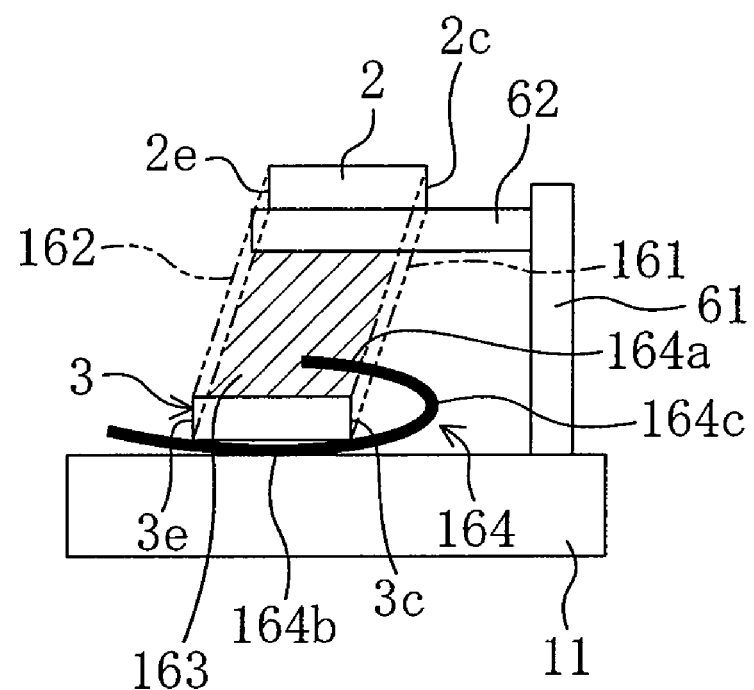
FIG. 17 is a diagram for explaining the shape of a thermally-conductive sheet member.

FIG. 16 is a side view showing the configuration of a semiconductor module 160 according to a first variant of the fifth embodiment. FIG. 17 is a diagram for explaining the shape of an upper part 164a of a thermally-conductive sheet member 164. In FIG. 16, conductive wires are not shown. In FIG. 17, for clarification of this figure, an insulating member, a heat-releasing member and cooling fins of a heat sink 1 are not shown.

In this variant, unlike the fifth embodiment, the upper part 164a of the thermally-conductive sheet member 164 does not cover the entire top surface 3a of a semiconductor device 3. This situation will be specifically described below.

The upper part 164a exists in a third region 163 (a diagonally shaded region shown in FIG. 17) between a first region 161 and a second region 162. The first region 161 is a region formed by providing a connection between a first side surface 3c of the semiconductor device 3 and a first side surface 2c of an electronic component 2, and the second region 162 is a region formed by providing a connection between a third side surface 3e of the semiconductor device 3 and a third side surface 2e of the electronic component 2.

As described in the first embodiment or any other embodiment or variant, the first side surface 3c of the semiconductor device 3 is a side surface thereof covered with a side part 164c of the thermally-conductive sheet member 164, and the third side surface 3e of the semiconductor device 3 is a side surface thereof opposed to the first side surface 3c. Furthermore, as shown in FIG. 17, when the first side surface 3c of the semiconductor device 3 is seen from the front, the first side surface 2c of the electronic component 2 is one of the side surfaces of the electronic component 2 located at the front, and the third side surface 2e of the electronic component 2 is another one thereof opposed to the first side surface 2c.

Since, as described above, the upper part 164a of the thermally-conductive sheet member 164 partially exists in the third region 163, this situation can prevent heat from the semiconductor device 3 from being transmitted to the electronic component 2 as compared with the case where a thermally-conductive sheet member does not cover the top surface of a semiconductor device. As a result, heat isolation can be achieved.

Figure 18A:
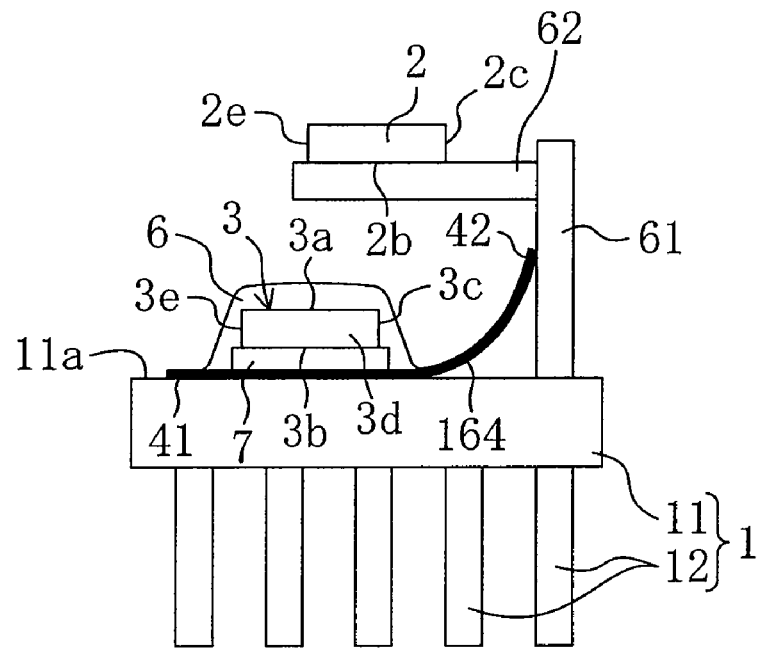
FIGS. 18(a) and 18(b) are side views showing a fabrication method for a semiconductor module according to the first variant of the fifth embodiment of the present invention.
Figure 18B:
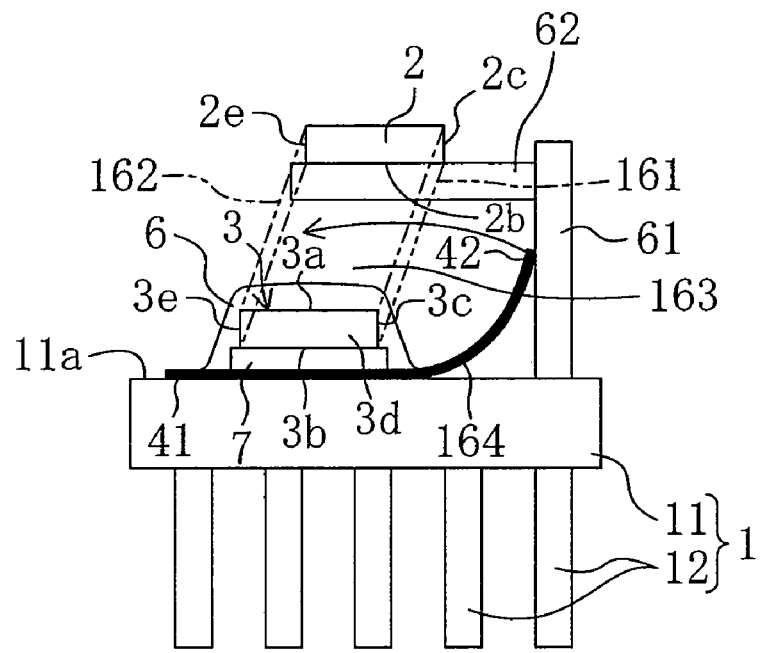

FIGS. 18(a) and 18(b) are side views showing a fabrication method for the semiconductor module 160 of this variant.

First, as shown in FIG. 18(a), a main body configured so that a mounting face 11a of a heat sink 1 is provided with a support 61 and a second board 62 is prepared. A thermally-conductive sheet member 164 is disposed on the mounting face 11a so that the other end 42 of the thermally-conductive sheet member 164 is located closer to the support 61 than the one end 41 thereof. Then, the semiconductor device 3 is mounted on a part of the thermally-conductive sheet member 164 located on the one end 41 side (exactly, a part thereof located on the one end 41 side and having an area of ⅕ or more of the surface area of the thermally-conductive sheet member 164 (a first part)) so that a first side surface 3c of the semiconductor device 3 is located closer to the support 61 than a third side surface 3e thereof. Thereafter, the semiconductor device 3 is electrically connected through conductive wires (not shown) to electrode terminals (not shown) disposed on the heat sink 1. An insulating member 6 is injected onto the top surface 3a of the semiconductor device 3 to cover the top surface 3a and the conductive wires.

Next, an electronic component 2 is mounted on the second board 62 so that its first side surface 2c is located closer to the support 61 than its third side surface 2e (step (b)). The electronic component 2 is electrically connected through conductive wires (not shown) to electrode terminals (not shown) disposed on the second board 62.

Subsequently, as shown in FIG. 18(b), the thermally-conductive sheet member 164 is bent so that the other end 42 of the thermally-conductive sheet member 164 exists in a third region 163 (step (c)). In this manner, a second part of the thermally-conductive sheet member 164 (in this variant, a side part 164c of the thermally-conductive sheet member 164) covers the first side surface 3c of the semiconductor device 3, thereby fabricating the semiconductor module 160 of this variant.

In this variant, an electronic component may be disposed immediately above a semiconductor device. In this case, a thermally-conductive sheet member may be bent as in this variant and alternatively may be bent as described in the fifth embodiment.

(Second Variant)

Figure 19:
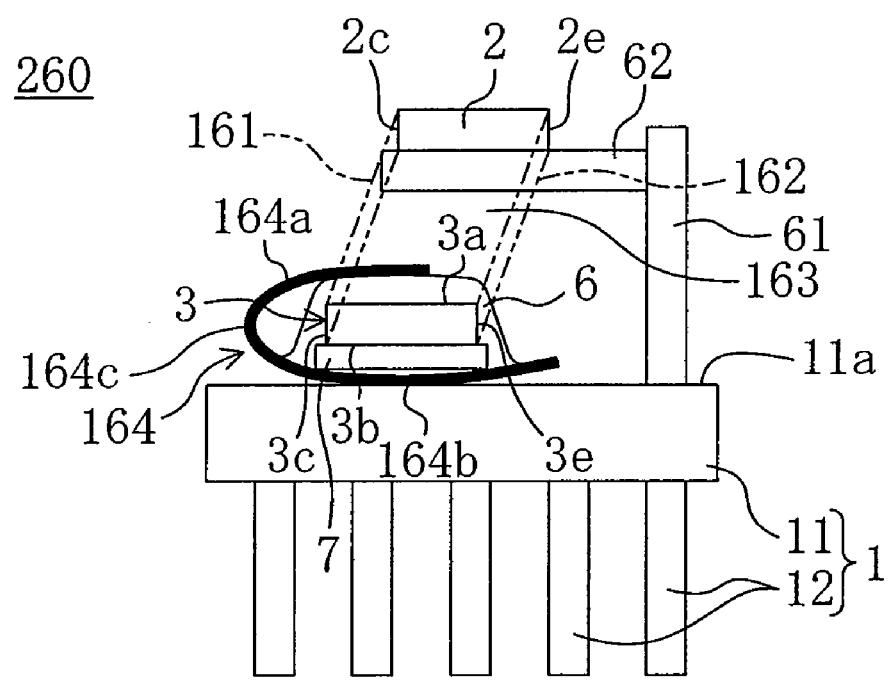
FIG. 19 is a side view showing the configuration of a semiconductor module according to a second variant of the fifth embodiment of the present invention.

FIG. 19 is a side view showing the configuration of a semiconductor module 260 according to a second variant of the fifth embodiment.

In this variant, like the first variant of the fifth embodiment, a thermally-conductive sheet member 164 has an upper part 164a, a lower part 164b and a side part 164c. However, unlike the first variant, the side part 164c is located across a semiconductor device 3 from a support 61. Thus, space for providing the side part 164c does not need to be prepared between the semiconductor device 3 and the support 61. Therefore, the semiconductor device 3 can be mounted closer to the support 61 than in the first variant of the fifth embodiment. In view of the above, in this variant, a semiconductor module can be reduced in size as compared with the first variant of the fifth embodiment.

Comparison is made between FIGS. 16 and 19 as follows. In FIG. 16, the semiconductor device 3 is mounted so that its first side surface 3c is located closer to the support 61 than its third side surface 3e while, in FIG. 19, the semiconductor device 3 is mounted so that its third side surface 3e is located closer to the support 61 than its first side surface 3c. The reason for this is that a first side surface of a semiconductor device is defined herein as a side surface of the semiconductor device covered with a side part of a thermally-conductive sheet member. Furthermore, in FIG. 16, the electronic component 2 is mounted so that its first side surface 2c is located closer to the support 61 than its third side surface 2e while, in FIG. 19, the electronic component 2 is mounted so that its third side surface 2e is located closer to the support 61 than its first side surface 2c. The reason for this is that a first side surface of an electronic component is defined herein as a side surface of the electronic component located at the front when a first side surface of a semiconductor device is seen from the front.

Figure 20A:
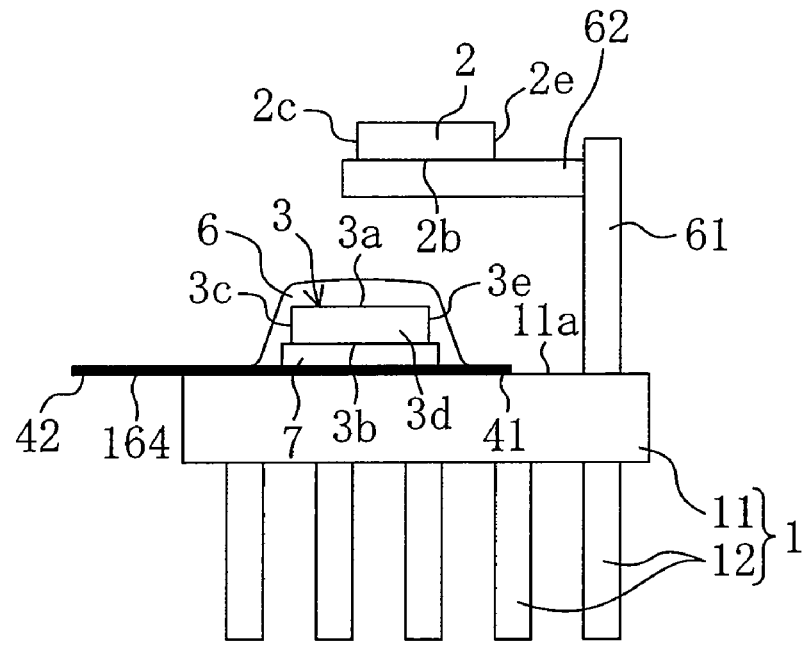
FIGS. 20(a) and 20(b) are side views showing a fabrication method for a semiconductor module according to the second variant of the fifth embodiment of the present invention.
Figure 20B:
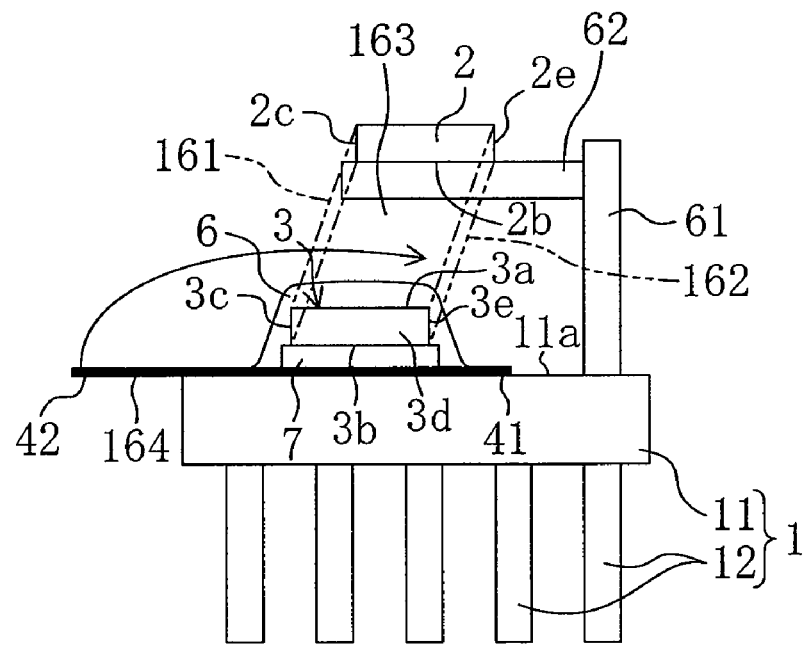

FIGS. 20(a) and 20(b) are side views showing a fabrication method for the semiconductor module 260 of this variant. The difference between the fabrication method of this variant and the fabrication method of the first variant of the fifth embodiment will be mainly described below.

In the step shown in FIG. 20(a), unlike the step shown in FIG. 18(a), a thermally-conductive sheet member 164 is disposed on a mounting face 11a so that one end 41 of the thermally-conductive sheet member 164 is located closer to a support 61 than the other end 42 thereof.

In the step shown in FIG. 20(b), like the step shown in FIG. 18(b), the thermally-conductive sheet member 164 is bent so that the other end 42 of the thermally-conductive sheet member 164 exists in a third region 163 (step (c)). In this manner, the semiconductor module 260 of this variant can be fabricated.

In order to prevent the temperature of the support 61 from rising due to heat generated by the semiconductor device 3, the semiconductor module 260 is preferably configured as described in the first variant of the fifth embodiment. However, in order to reduce the size of a semiconductor module and simplify the fabrication thereof, the semiconductor module is preferably configured as described in this variant.

(Third Variant)

Figure 21:
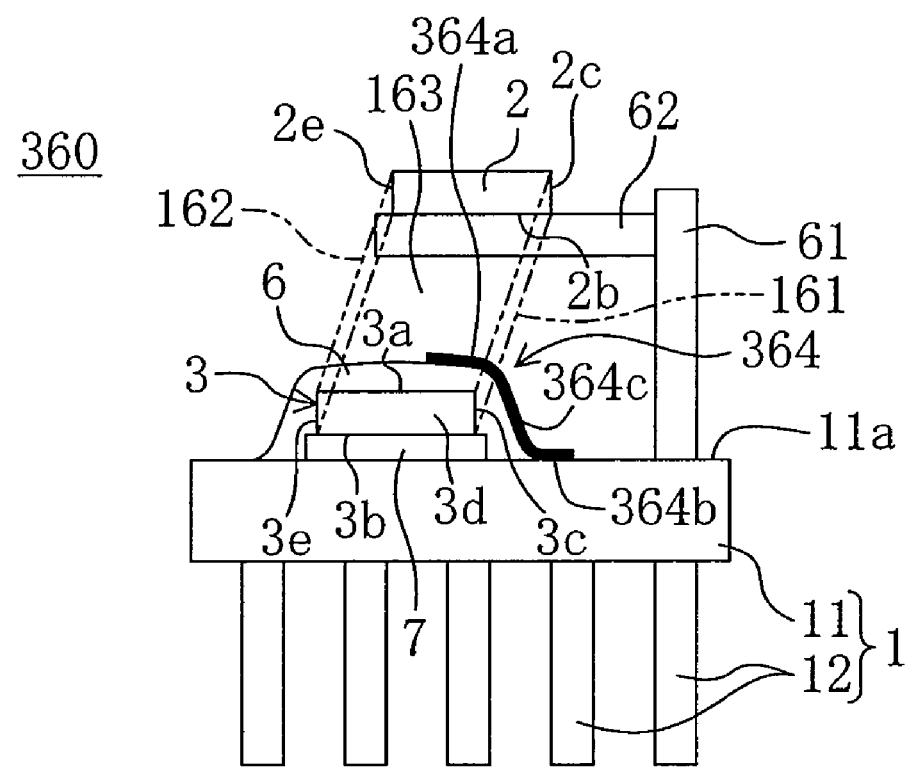
FIG. 21 is a side view showing the configuration of a semiconductor module according to a third variant of the fifth embodiment of the present invention.

FIG. 21 is a side view showing the configuration of a semiconductor module 360 according to a third variant of the fifth embodiment. In this figure, conductive wires are not shown.

In this variant, a thermally-conductive sheet member 364 has an upper part 364a, a lower part 364b and a side part 364c. Like the upper part 164a described in the first variant of the fifth embodiment, the upper part 364a exists in a third region 163. Furthermore, like the third embodiment, the lower part 364b is disposed on part of a mounting face 11a located to the outside of the semiconductor device 3. Also in such a case, heat isolation can be achieved.

Figure 22A:
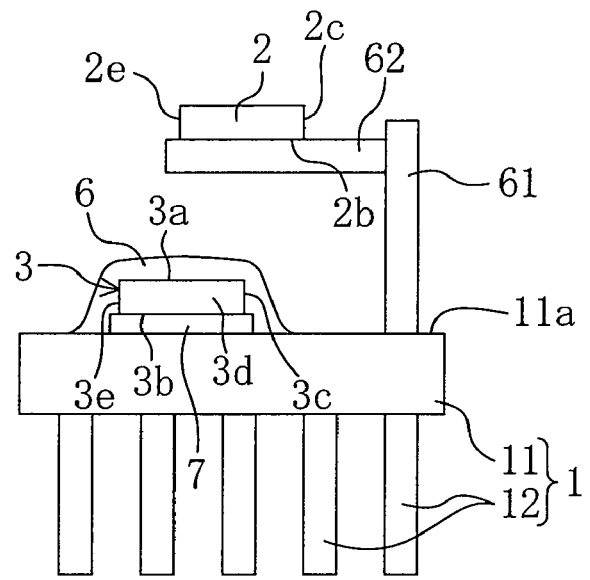
FIGS. 22(a) and 22(b) are side views showing a fabrication method for a semiconductor module according to the third variant of the fifth embodiment of the present invention.
Figure 22B:
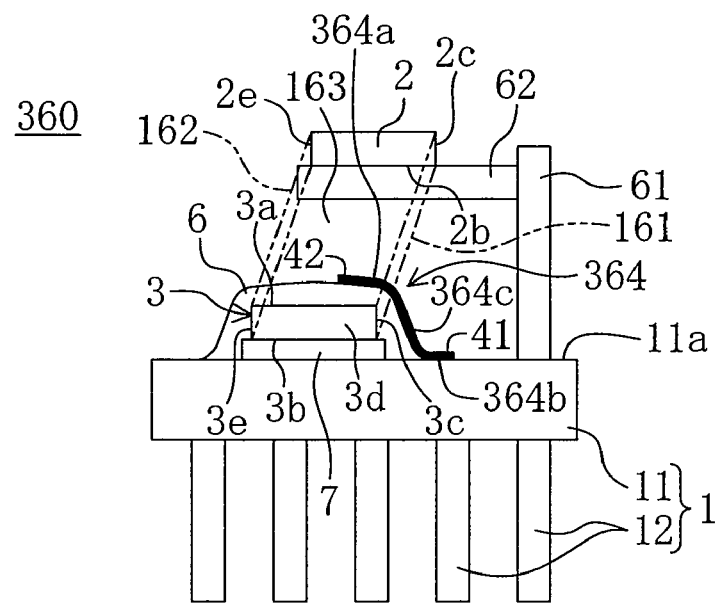

FIGS. 22(a) and 22(b) are diagrams showing a fabrication method for the semiconductor module of this variant.

First, as shown in FIG. 22(a), a main body configured so that a mounting face 11a of a heat sink 1 is provided with a support 61 and a second board 62 is prepared. Then, a semiconductor device 3 is mounted on the mounting face 11a, and an electronic component 2 is mounted on the second board 62 (step (a)). Thereafter, the semiconductor device 3 is electrically connected through conductive wires (not shown) to electrode terminals (not shown) disposed on the heat sink 1. The insulating member 6 is injected onto the top surface 3a of the semiconductor device 3 to cover the top surface 3a and the conductive wires (not shown). Furthermore, the electronic component 2 is electrically connected through conductive wires to electrode terminals (not shown) disposed on the second board 62.

Next, as shown in FIG. 22(b), a thermally-conductive sheet member 364 covers a first side surface 3c of the semiconductor device 3. In this case, the thermally-conductive sheet member 364 is bent so that a part of the thermally-conductive sheet member 364 located on one end 41 side thereof is brought into contact with the mounting face 11a of the heat sink 1 and the other end 42 of the thermally-conductive sheet member 364 exists in a third region 163 (step (b)). Also in this variant, the thermally-conductive sheet member 364 is preferably disposed so that the area of a part of the thermally-conductive sheet member 364 coming into contact with the mounting face 11a becomes ⅕ or more of the surface area of the thermally-conductive sheet member 364. In view of the above, the semiconductor module 360 of this variant can be fabricated.

The shape of a thermally-conductive sheet member may be any one of the shapes described in the third embodiment (FIG. 7) and the second and third variants of the third embodiment (FIGS. 11, 12). Furthermore, the thermally-conductive sheet member may be bent so that its side part is located across a semiconductor device from a support.

Other Embodiments

The semiconductor modules of the first through fifth embodiments may be configured as follows.

A heat sink may have a cooling path for cooling a board instead of cooling fins. Liquid, such as water or oil, or air may be used for the cooling path. The heat sink may be configured so that the cooling path is embedded in a board.

A semiconductor module may be enclosed by a package. A known package can be used as the package without being particularly limited. Examples of the package include a plastic seal package, a ceramic package, a metal package, a glass package, and other packages.

In the case where, as described in the first, second, fourth, and fifth embodiments, a target component is mounted on a lower part of a thermally-conductive sheet member, a hole may be formed in the lower part. When a hole is formed in the lower part, the hole can be filled with a conductive adhesive, such as solder, thereby fixing the target component through the conductive adhesive to a heat sink. As described in the first embodiment, the surface area of the lower part formed with the hole is preferably ⅕ or more of the entire surface area of the thermally-conductive sheet member.

The number of semiconductor devices of the semiconductor module and the number of electronic components thereof are not limited to the above-described numbers. In any case, the thermally-conductive sheet member only needs to cover a part of one of the semiconductor devices and the electronic components so that heat from the semiconductor devices can be isolated from the electronic components.

In the above description, a single thermally-conductive sheet member is bent. However, the thermally-conductive sheet member may include a plurality of sheet members. In this case, upper, lower and side parts of the thermally-conductive sheet member are preferably composed of different sheet members which are joined together.

In each of the first and third through fifth embodiments, the timing at which an electronic component is mounted is not limited to the above-described timing.

EXAMPLES

In the following examples, on condition that the semiconductor modules of the first through fourth embodiments are operated, temperature changes of associated semiconductor devices and associated electronic components were examined.

Example 1

In a first example, substantially the same semiconductor module as in the first embodiment (hereinafter, referred to as "the semiconductor module of this example) was used. In addition, the semiconductor module of the reference example shown in FIG. 23 was also used.

The semiconductor module of this example was fabricated in accordance with the method described in the first embodiment. In this case, a hole is formed in a thermally-conductive sheet member prepared in the step shown in FIG. 3(a). In the step shown in FIG. 3(b), the hole was filled with solder, and a semiconductor device was disposed to cover the filled hole.

On the other hand, in the semiconductor module of the reference example, the distance between an associated semiconductor device and an associated electronic component was set at substantially the same distance as that between the semiconductor device of the semiconductor module of this example and an electronic component thereof. In other words, the above-mentioned distance for the semiconductor module of the reference example used in this example was shorter than that shown in FIG. 23.

Thereafter, the temperature of a heat sink of each example was set at 85° C., and then the semiconductor module of this example and the semiconductor module of the reference example were operated. After the completion of operation, the temperatures of the semiconductor device and electronic component of each module were measured. Consequently, for the semiconductor module of this example, the temperature of the associated semiconductor device was approximately 120° C., and the temperature of the associated electronic component was kept at 90° C. or less. On the other hand, for the semiconductor module of the reference example, the temperature of the associated electronic component was approximately 110° C.

Moreover, a semiconductor module provided without any thermally-conductive sheet member and the semiconductor module of this example were prepared. While a semiconductor device of each module is switched at 100 kHz, the electronic noise level was measured at a location 5 cm away from the semiconductor module. Consequently, the provision of a thermally-conductive sheet member allowed the electronic noise level to become one or more orders of magnitude smaller than in the case of the semiconductor module provided without any thermally-conductive sheet member.

Example 2

In a second example, the semiconductor module of the second embodiment was used. In other words, the semiconductor module shown in FIG. 6 was used.

First, after the fabrication of the semiconductor module of the second embodiment, the temperature of the associated heat sink was set at 85° C., and then the semiconductor module was operated. After the completion of operation, the temperatures of the semiconductor device and electronic component of the semiconductor module were measured. Consequently, the temperature of the semiconductor device was approximately 120° C., and the temperature of the electronic component was kept at 90° C. or less.

Example 3

In a third example, the two semiconductor modules of the third embodiment, i.e., the semiconductor module shown in FIG. 7 and the semiconductor module shown in FIG. 13, were used.

First, the semiconductor modules shown in FIGS. 7 and 13 were fabricated in accordance with the method described in the third embodiment. Thereafter, the temperature of the heat sink of each semiconductor module was set at 85° C., and then the semiconductor modules were operated. After the completion of operation, the temperatures of the semiconductor device and electronic component of each semiconductor module were measured. Consequently, for the semiconductor module shown in FIG. 7, the temperature of the associated semiconductor device was approximately 120° C., and the temperature of the associated electronic component was kept at 90° C. or less. For the semiconductor module shown in FIG. 13, the temperature of the associated semiconductor device is approximately 120° C., and the temperature of the associated electronic component was 90° C. or less.

Example 4

In a fourth example, substantially the same semiconductor module as the semiconductor module of the fourth embodiment was used. In other words, the semiconductor module shown in FIG. 14 was used.

First, the semiconductor module of the fourth embodiment was fabricated. In this case, as described in the first example, a hole is formed in the thermally-conductive sheet member. The hole was filled with solder, and the semiconductor device was disposed to cover the filled hole. Thereafter, the temperature of the heat sink was set at 85° C., and then the semiconductor module was operated. After the completion of operation, the temperatures of the semiconductor device and electronic component of the module were measured. Consequently, the temperature of the semiconductor device was approximately 120° C., and the temperature of the electronic component was kept at 90° C. or less.

In view of the above, as described in the first through fourth examples, it was possible to prevent the temperature of an electronic component from rising and reduce the degree of increase in the temperature of a semiconductor device.

INDUSTRIAL APPLICABILITY

As described above, the present invention makes it possible to combine a semiconductor device and an electronic component or any other component together and provide a low-loss, compact and low-cost semiconductor module. A semiconductor module of the present invention is suitable for being used for a semiconductor module including a semiconductor device using a wide band gap semiconductor, such as silicon carbide, GaN, or diamond.

The invention claimed is:

1. A semiconductor module comprising:
a heat sink having a mounting face;
a semiconductor device mounted on the mounting face, the semiconductor device generating a relatively large amount of heat during operation;
an electronic component mounted on the mounting face so as to be adjacent to the semiconductor device, the electronic component generating a relatively small amount of heat during operation; and
a thermally-conductive sheet member covering part of a target component, the target component being any one of the semiconductor device and the electronic component, wherein:
the thermally-conductive sheet member has a lower part coming into contact with the mounting face and a side part having a sheet shape and extending from the lower part to a space between the semiconductor device and the electronic component,
the target component has four side surfaces,
the side part of the thermally-conductive sheet member covers at least one of the four side surfaces of the target component, and
the at least one of the four side surfaces is a surface facing the other component different from the target component of the semiconductor device and the electronic component, and.

2. The semiconductor module of claim 1, wherein the thermal conductivity of the thermally-conductive sheet member is 400 W/(m·K) or more.

3. The semiconductor module of claim 2, wherein the thermally-conductive sheet member is a graphite sheet.

4. The semiconductor module of claim 1, wherein the thermally-conductive sheet member further has an upper part extending from the side part to cover at least part of the top surface of the target component.

5. The semiconductor module of claim 4, wherein the target component is the semiconductor device.

6. The semiconductor module of claim 1, wherein the lower part of the thermally-conductive sheet member is interposed between the mounting face and the bottom surface of the target component.

7. The semiconductor module of claim 6 further comprising an electrode terminal and a conductive wire,
wherein the conductive wire extends from the target component outward of the thermally-conductive sheet member while passing between the upper and lower parts of the thermally-conductive sheet member, and thereby the conductive wire is connected to the electrode terminal.

8. The semiconductor module of claim 1, wherein the lower part of the thermally-conductive sheet member is disposed on a part of the mounting face between the target component and the other component.

9. The semiconductor module of claim 8 further comprising an electrode terminal and a conductive wire,
wherein the conductive wire extends from the target component outward of the thermally-conductive sheet member while passing between the upper part of the thermally-conductive sheet member and the mounting face, and thereby the conductive wire is connected to the electrode terminal.

10. The semiconductor module of claim 1 further comprising an insulating member interposed between the target component and the thermally-conductive sheet member.

11. The semiconductor module of claim 1, wherein the electronic component is disposed above the top surface of the semiconductor device.

12. The semiconductor module of claim 1 further comprising a heat spreading plate disposed between the mounting face and the bottom surface of the semiconductor device.

13. The semiconductor module of claim 1, wherein the surface area of the lower part is ⅕ or more of the surface area of the thermally-conductive sheet member.

14. The semiconductor module of claim 1, wherein the thermally-conductive sheet member has a thickness greater than or equal to 0.025 mm and less than or equal to 0.3 mm.

15. The semiconductor module of claim 1, wherein an upper part of the thermally-conductive sheet member covers at least a top surface of a target component.

* * * * *

UNITED STATES PATENT AND TRADEMARK OFFICE
CERTIFICATE OF CORRECTION

Page 1 of 1

PATENT NO. : 8,030,758 B2
APPLICATION NO. : 12/373024
DATED : October 4, 2011
INVENTOR(S) : Makoto Kitabatake It is certified that error appears in the above-identified patent and that said Letters Patent is hereby corrected as shown below:

In Column 30, line 22 it reads "component, and." but should read --component.--

Signed and Sealed this
Seventeenth Day of April, 2012

David J. Kappos
*Director of the United States Patent and Trademark Office*